United States Patent
Zuniga et al.

(10) Patent No.: US 6,547,641 B2
(45) Date of Patent: Apr. 15, 2003

(54) CARRIER HEAD WITH A SUBSTRATE SENSOR

(75) Inventors: Steven M. Zuniga, Soquel, CA (US); Ming-Kuei Tseng, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/091,700

(22) Filed: Mar. 4, 2002

(65) Prior Publication Data

US 2002/0094766 A1 Jul. 18, 2002

Related U.S. Application Data

(60) Division of application No. 09/296,942, filed on Apr. 22, 1999, now Pat. No. 6,398,621, which is a continuation-in-part of application No. 08/862,350, filed on May 23, 1997, now Pat. No. 5,957,751.

(51) Int. Cl.⁷ .......................... B24B 49/00; B24B 51/00
(52) U.S. Cl. .......................... 451/8; 451/288; 451/289; 451/290
(58) Field of Search .............................. 279/3; 340/680; 451/8, 9, 285, 286, 287, 288, 289, 290, 385, 397, 388, 398

(56) References Cited

U.S. PATENT DOCUMENTS

| | | |
|---|---|---|
| 4,141,180 A | 2/1979 | Gill, Jr. et al. |
| 4,373,991 A | 2/1983 | Banks |
| 4,918,869 A | 4/1990 | Kitta |
| 5,081,795 A | 1/1992 | Tanaka et al. |
| 5,193,316 A | 3/1993 | Olmstead |
| 5,205,082 A | 4/1993 | Shendon et al. |
| 5,230,184 A | 7/1993 | Bukhman |
| 5,423,558 A | 6/1995 | Koeth et al. |
| 5,423,716 A | 6/1995 | Strasbaugh |
| 5,441,444 A | 8/1995 | Nakajima |
| 5,443,416 A | 8/1995 | Volodarsky et al. |
| 5,449,316 A | 9/1995 | Strasbaugh |
| 5,476,414 A | 12/1995 | Hirose et al. |
| 5,498,199 A | 3/1996 | Karlsrud et al. |
| 5,584,751 A | 12/1996 | Kobayashi et al. |
| 5,616,212 A | 4/1997 | Isobe |
| 5,624,299 A | 4/1997 | Shendon |
| 5,643,053 A | 7/1997 | Shendon |
| 5,681,215 A | 10/1997 | Sherwood et al. |
| 5,762,539 A | 6/1998 | Nakashiba et al. |
| 5,762,544 A | 6/1998 | Zuniga et al. |
| 5,797,789 A | 8/1998 | Tanaka et al. |
| 5,851,140 A | 12/1998 | Barns et al. |
| 5,921,853 A | 7/1999 | Nishio |
| 5,957,751 A | 9/1999 | Govzman et al. |
| 5,961,169 A | 10/1999 | Kalenian et al. |
| 6,093,082 A | 7/2000 | Somekh |
| 6,183,354 B1 | 2/2001 | Zuniga et al. |
| 6,244,932 B1 | 6/2001 | Govzman et al. |
| 6,398,621 B1 | 6/2002 | Zuniga et al. |

FOREIGN PATENT DOCUMENTS

| | | |
|---|---|---|
| DE | 8631087 | 4/1987 |
| EP | 0156746 A1 | 10/1985 |
| EP | 0653270 A1 | 5/1995 |
| EP | 0841123 | 5/1998 |
| JP | 61-25768 | 2/1986 |
| JP | 63-114870 | 5/1988 |
| JP | 63-300858 | 12/1988 |
| JP | 1-216768 | 8/1989 |
| JP | 2-224263 | 9/1990 |
| JP | 05 069310 | 3/1993 |

Primary Examiner—Timothy V. Eley
(74) Attorney, Agent, or Firm—Fish & Richardson

(57) ABSTRACT

A carrier head for a chemical mechanical polishing system includes a flexible membrane with a substrate receiving surface, a sensor mechanism to determine if a substrate is properly attached to the carrier head, and means for preventing fluid that may be located between the substrate and the flexible membrane from interfering with the substrate detection mechanism.

21 Claims, 16 Drawing Sheets

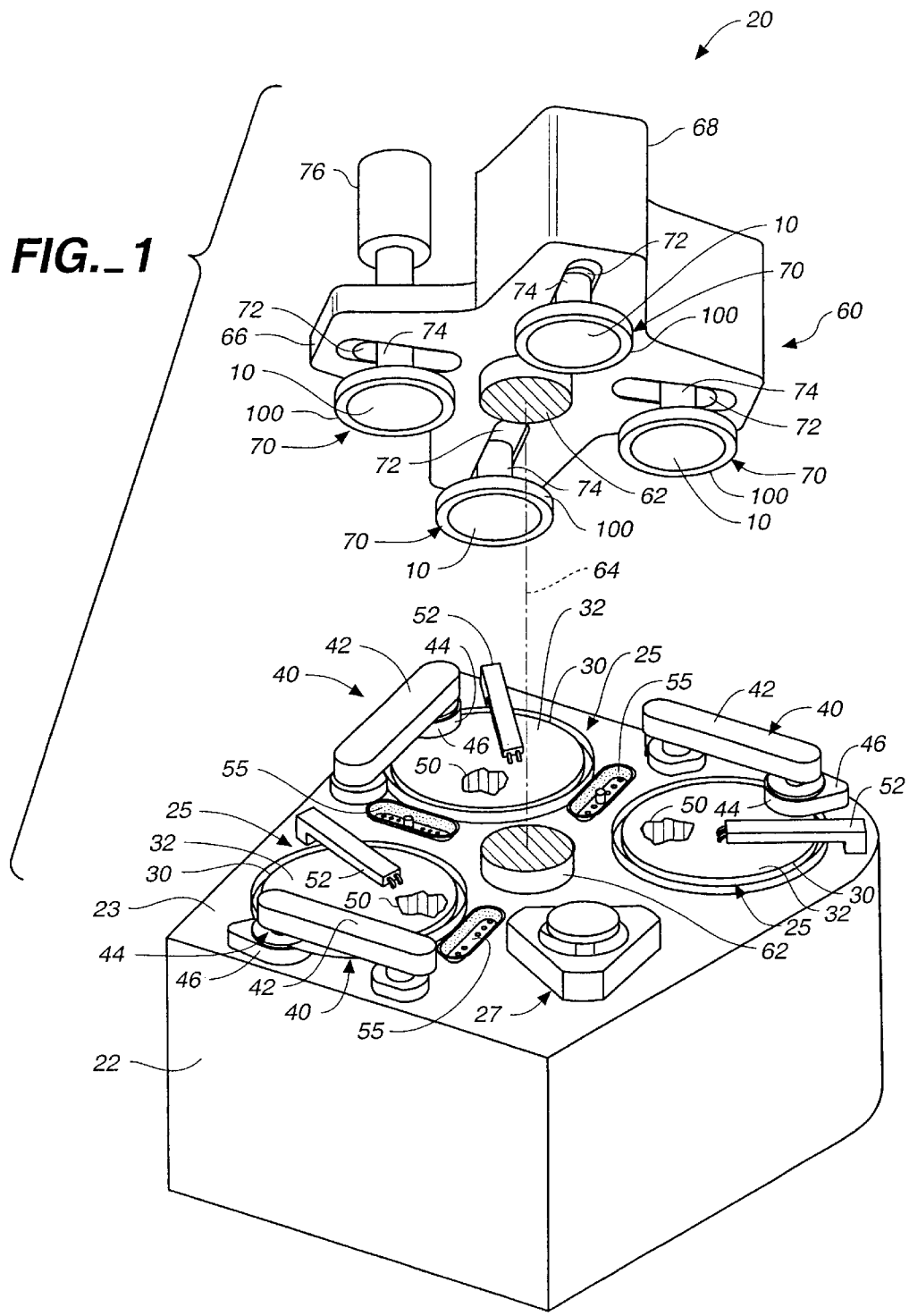
FIG._1

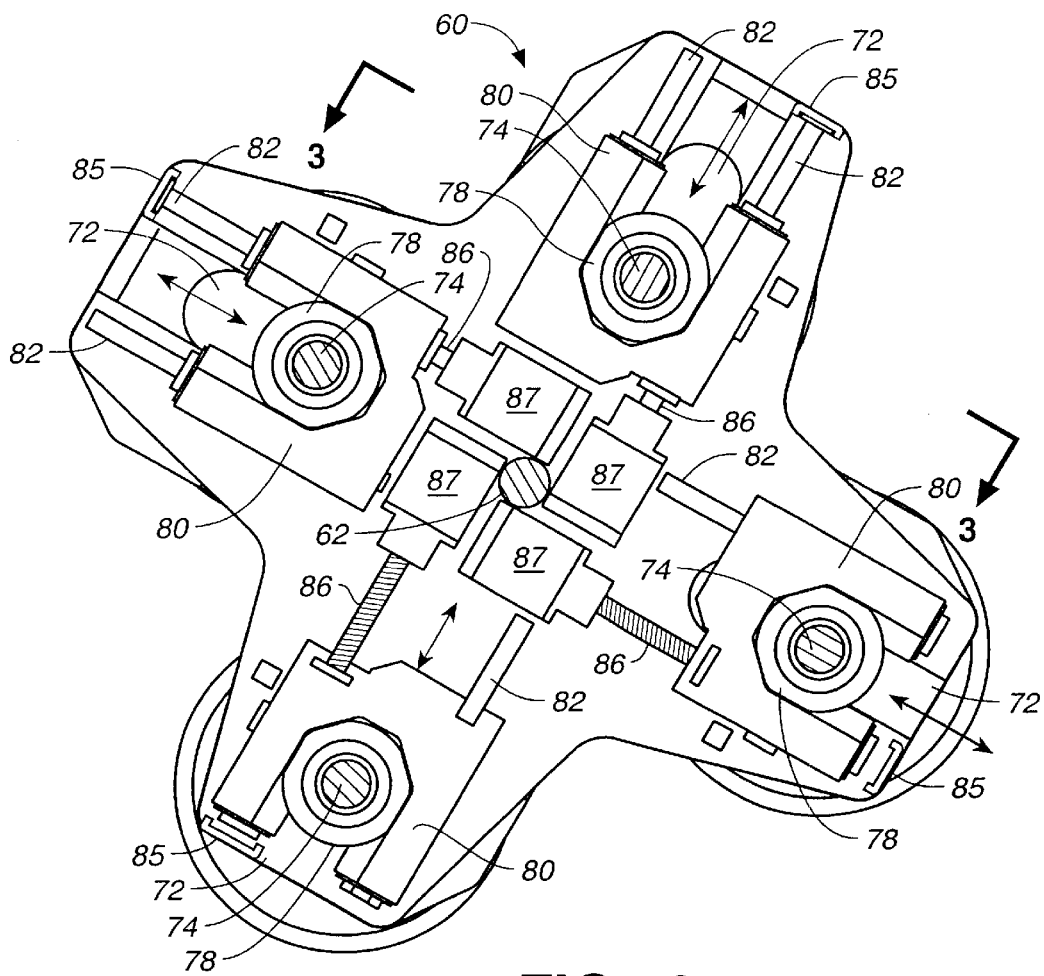
FIG._2

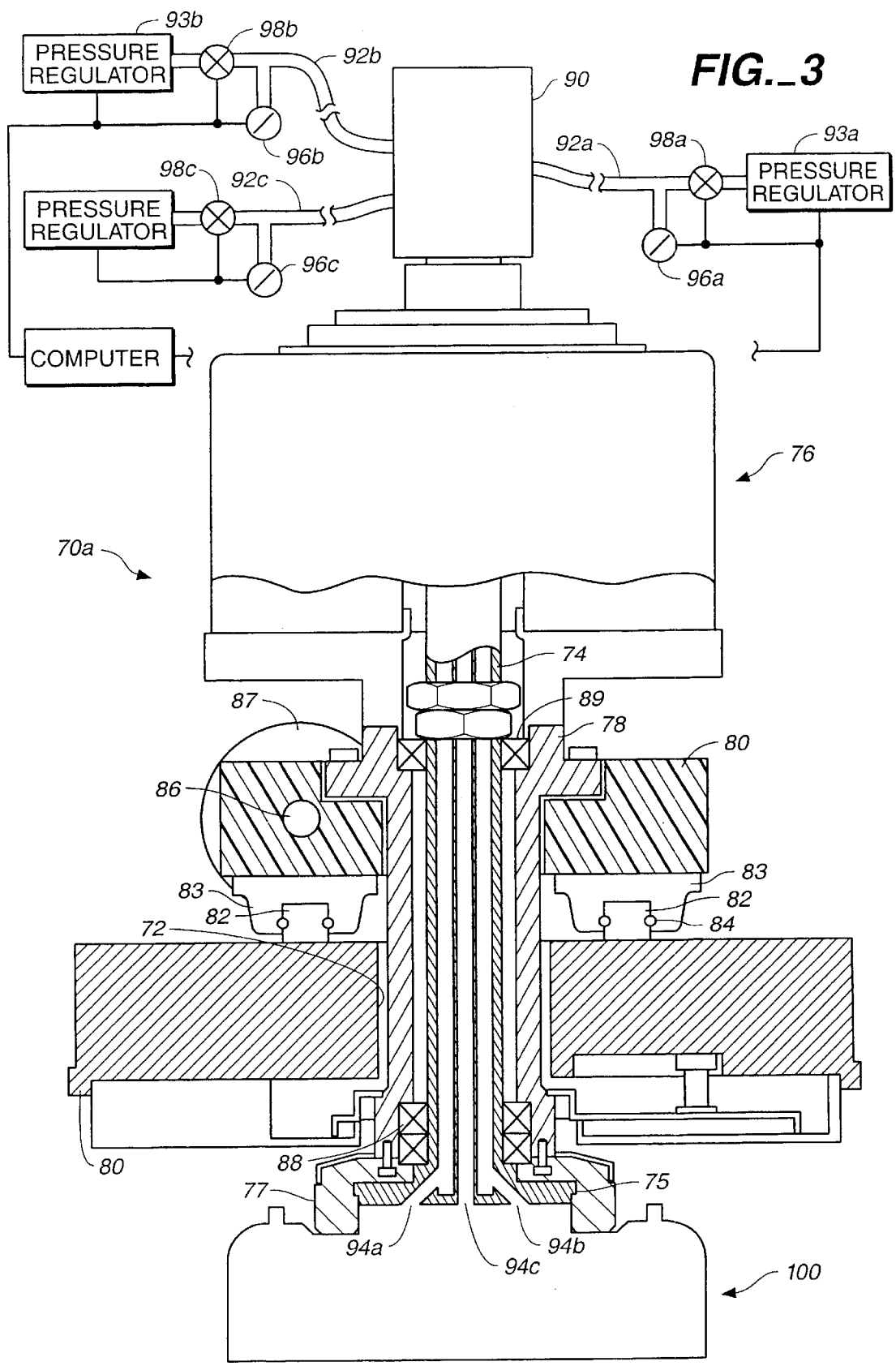

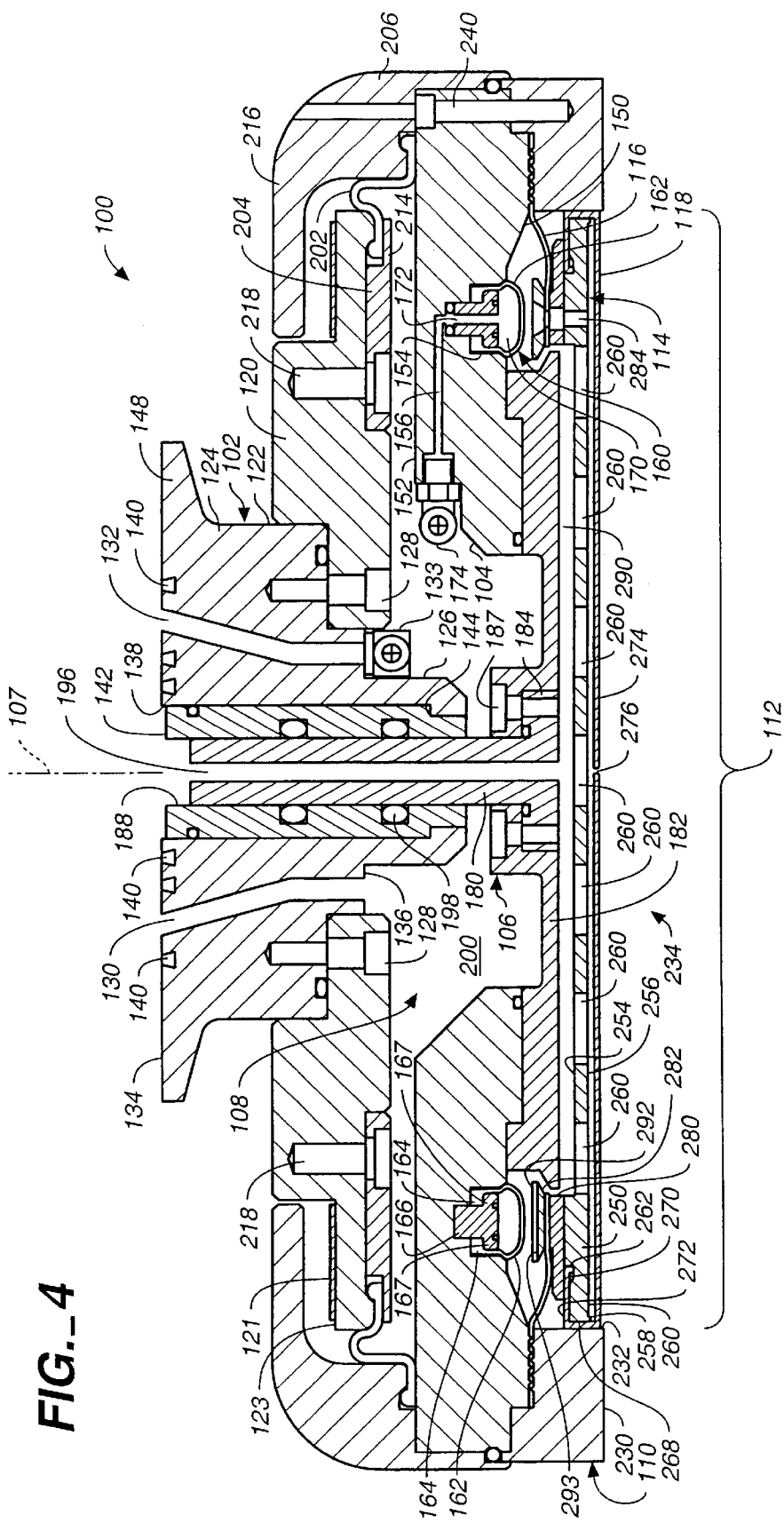
FIG._4

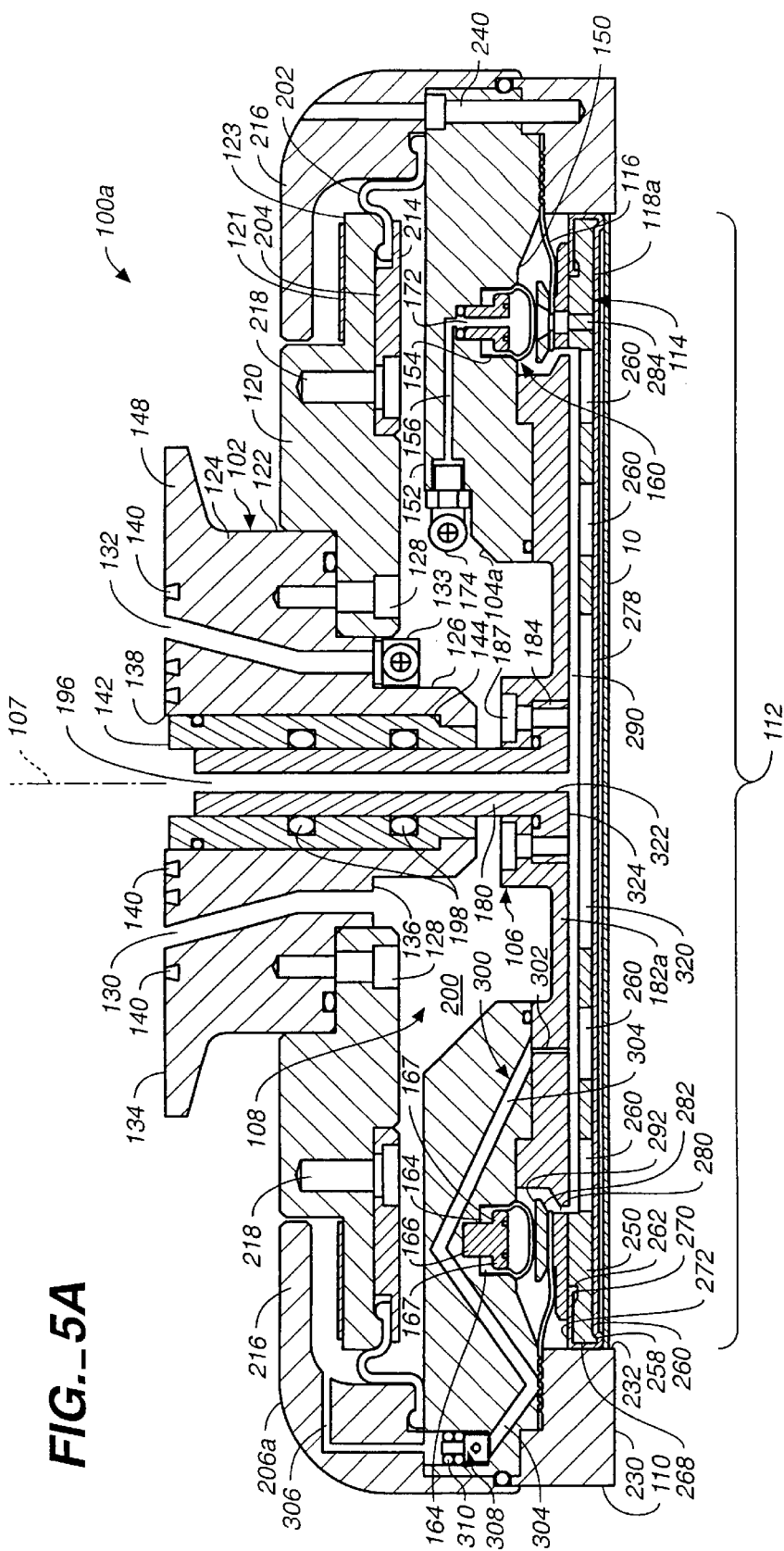
FIG._5A

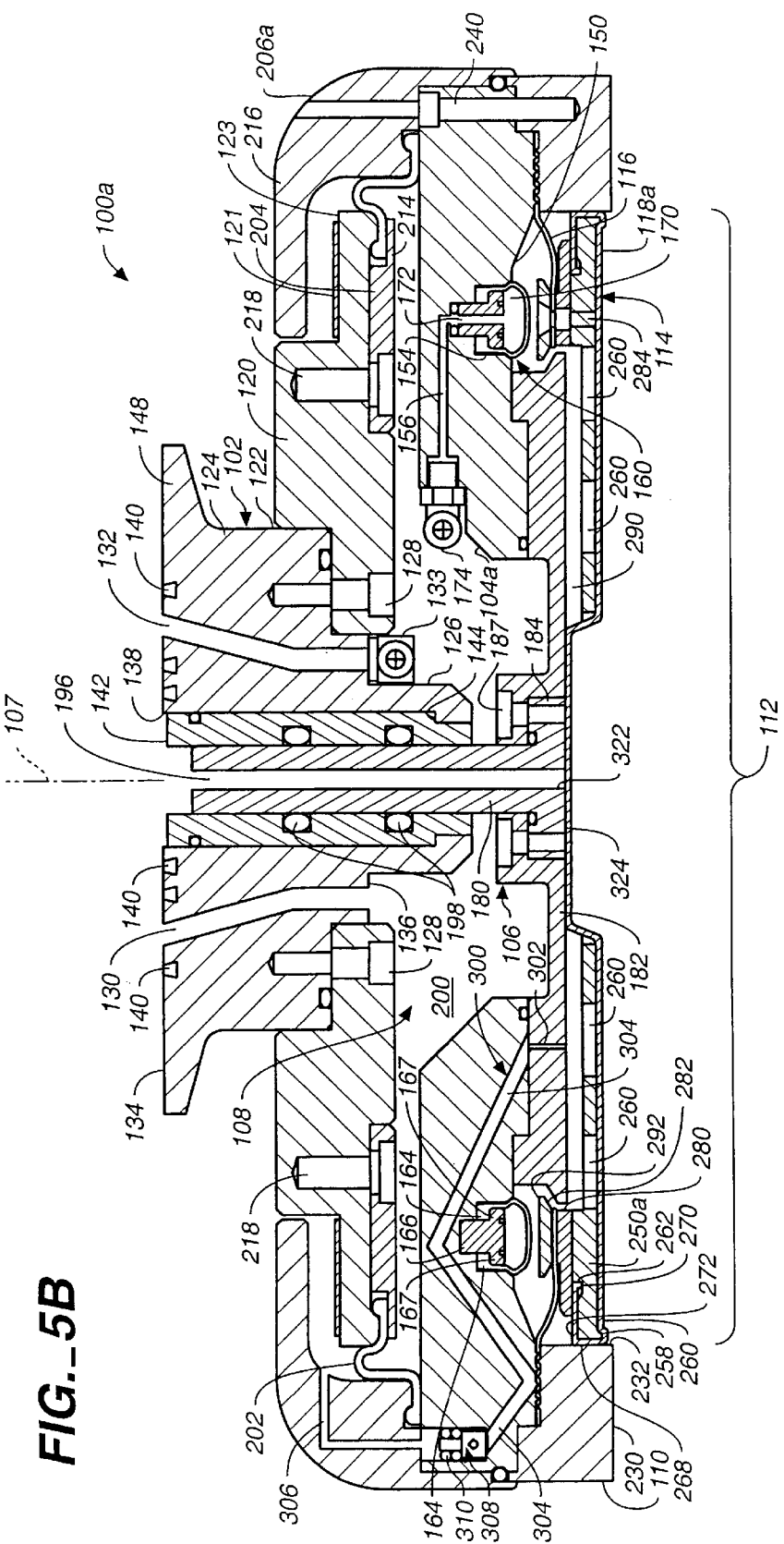
FIG._5B

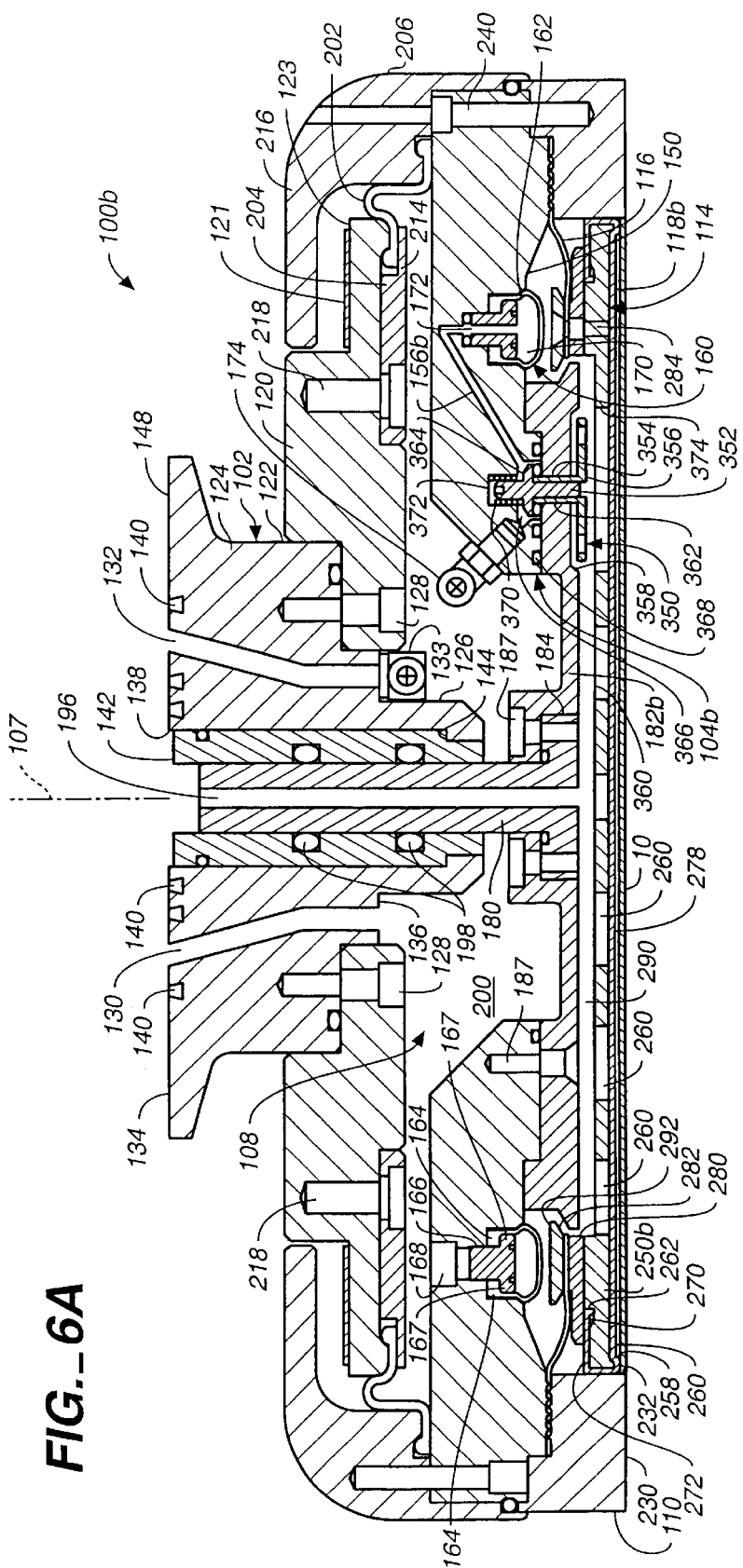
FIG._6A

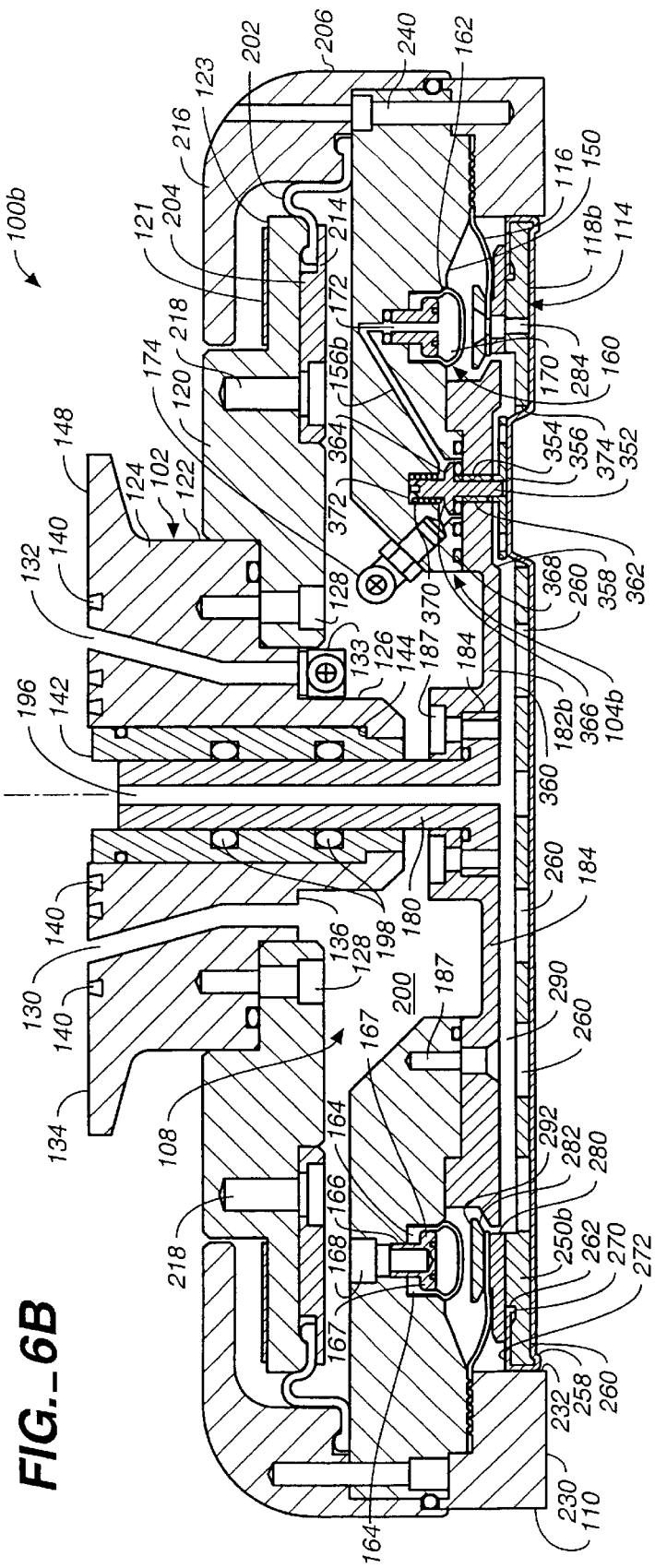
FIG._6B

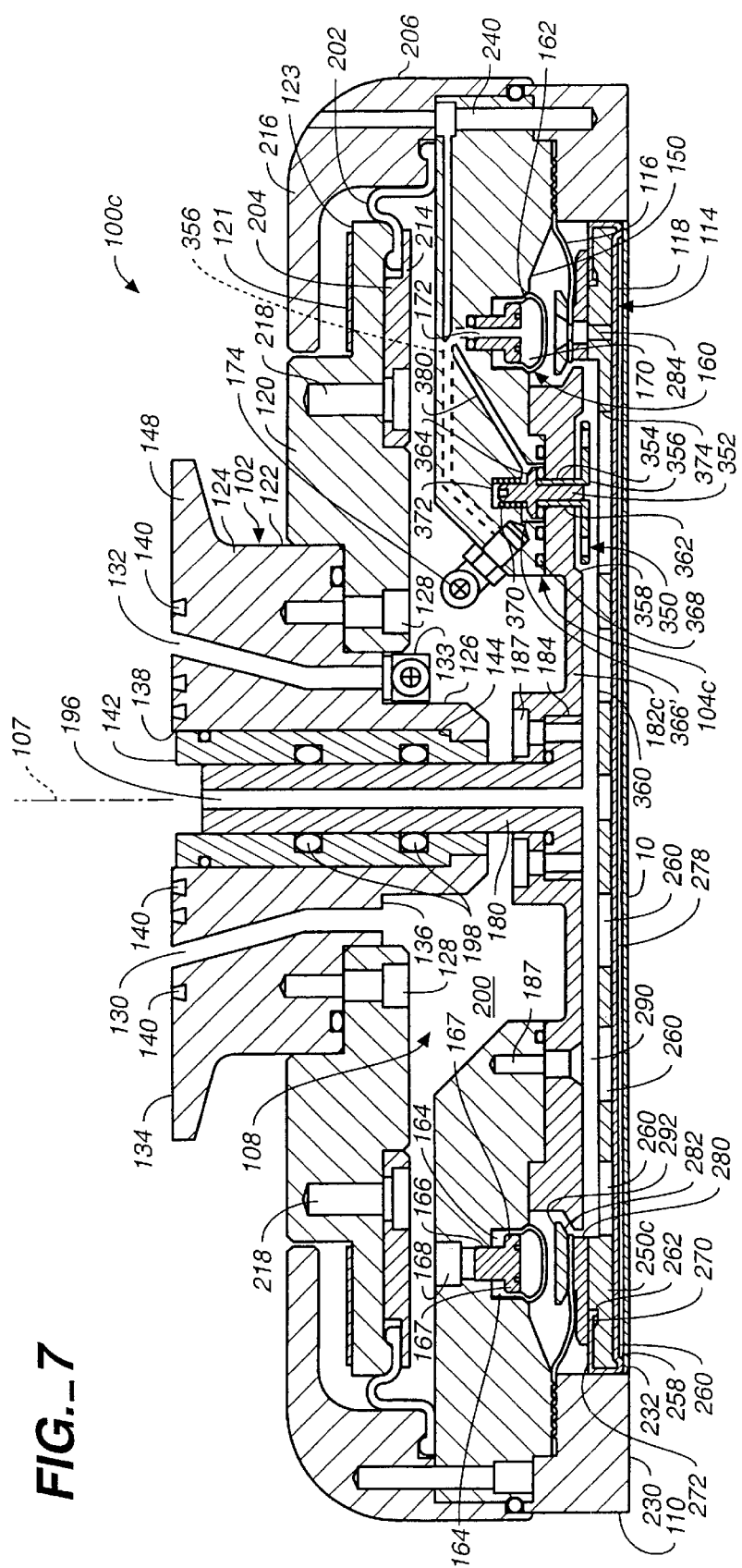
FIG._7

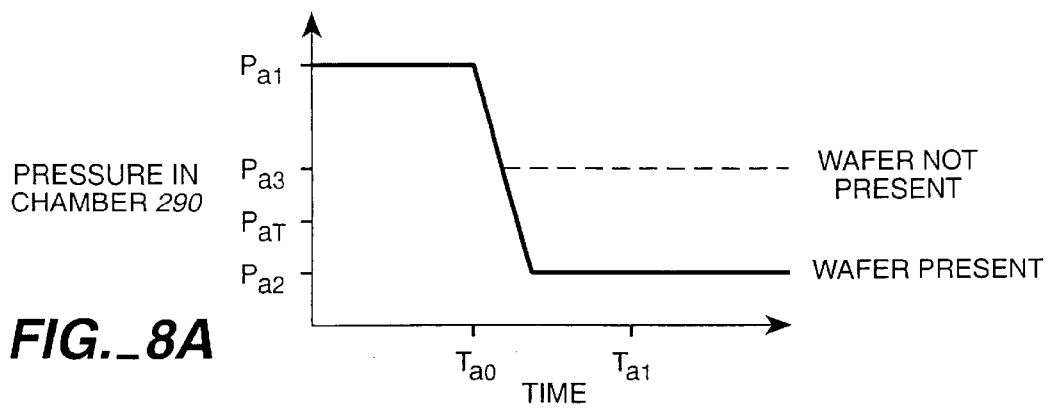
FIG._8A
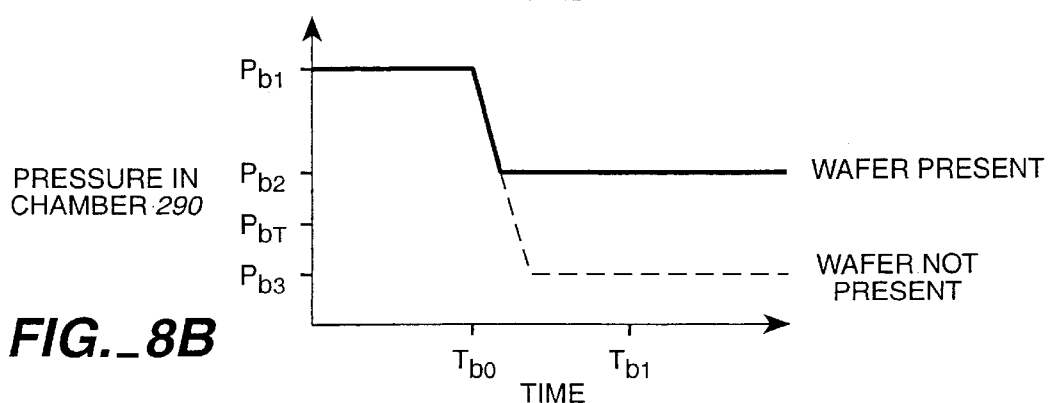
FIG._8B
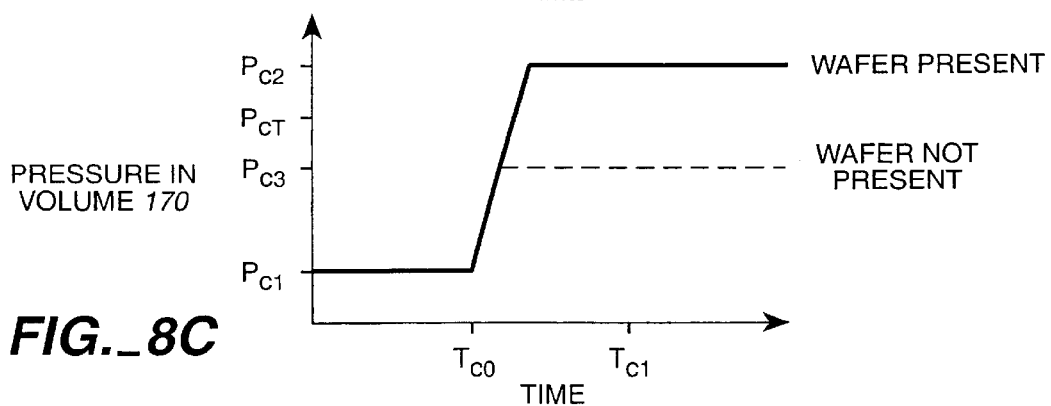
FIG._8C
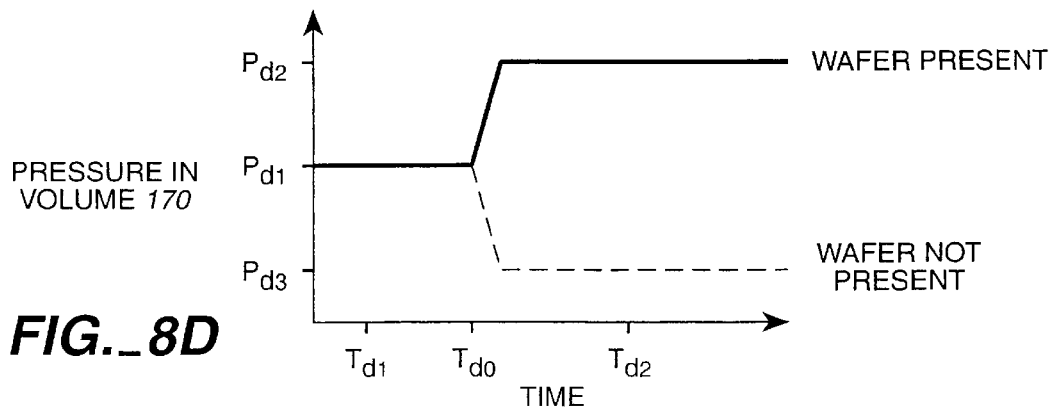
FIG._8D

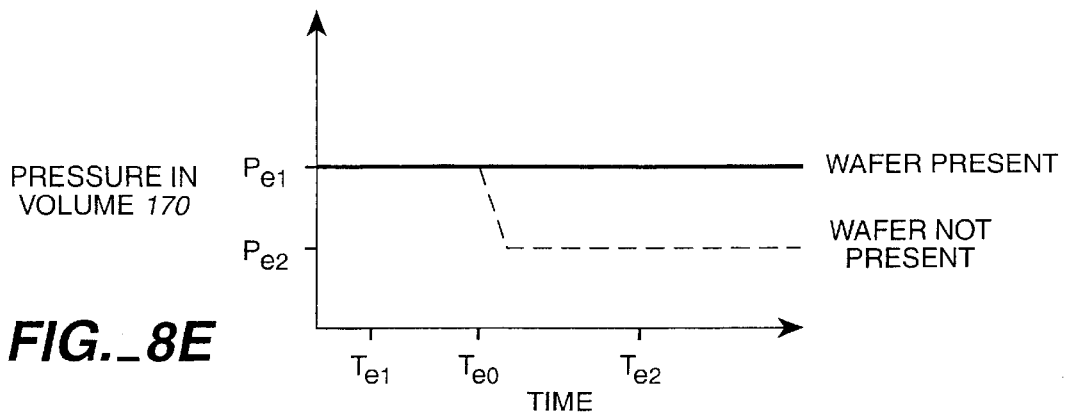
FIG._8E
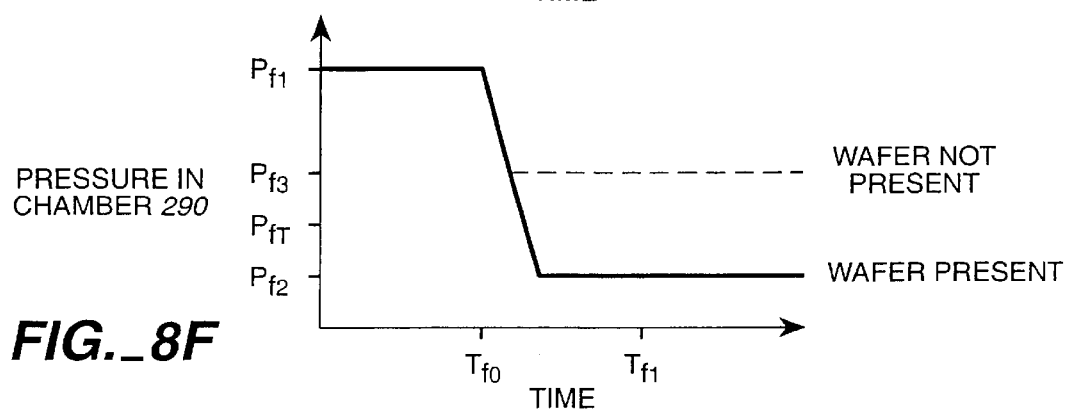
FIG._8F
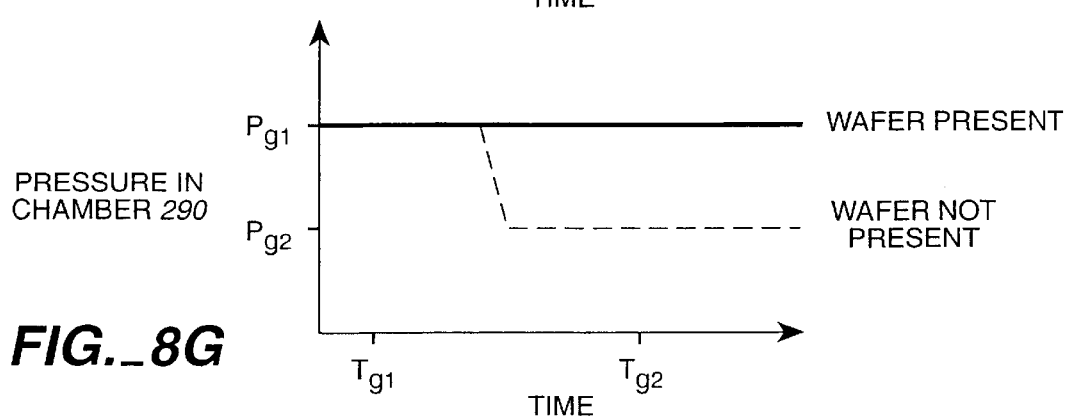
FIG._8G

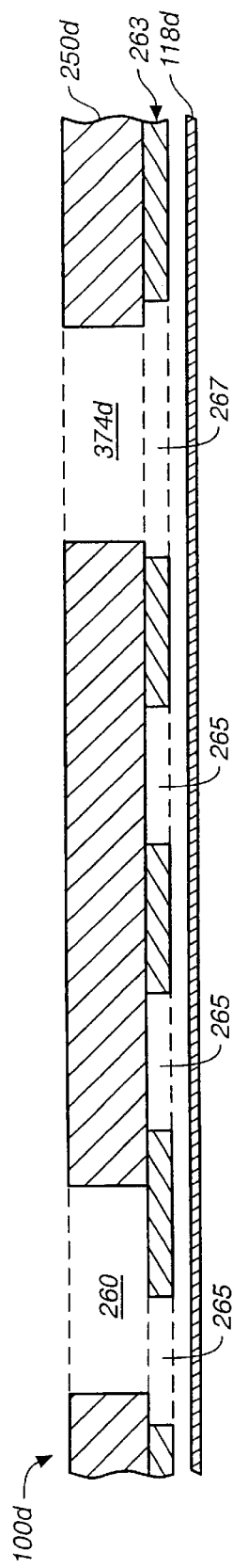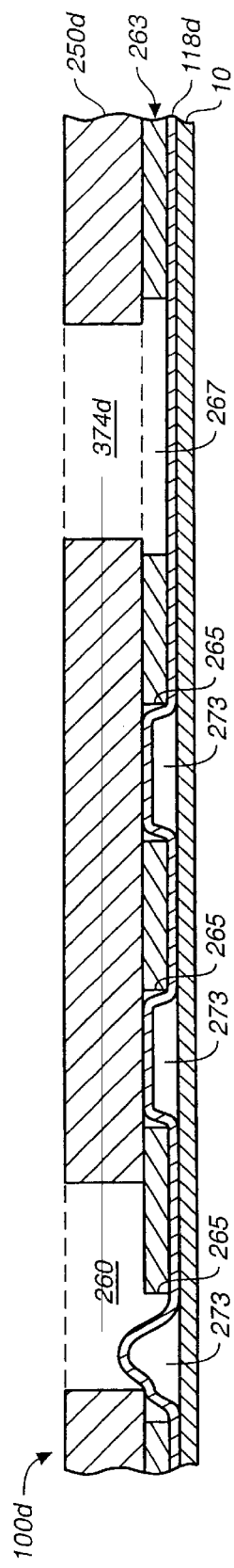

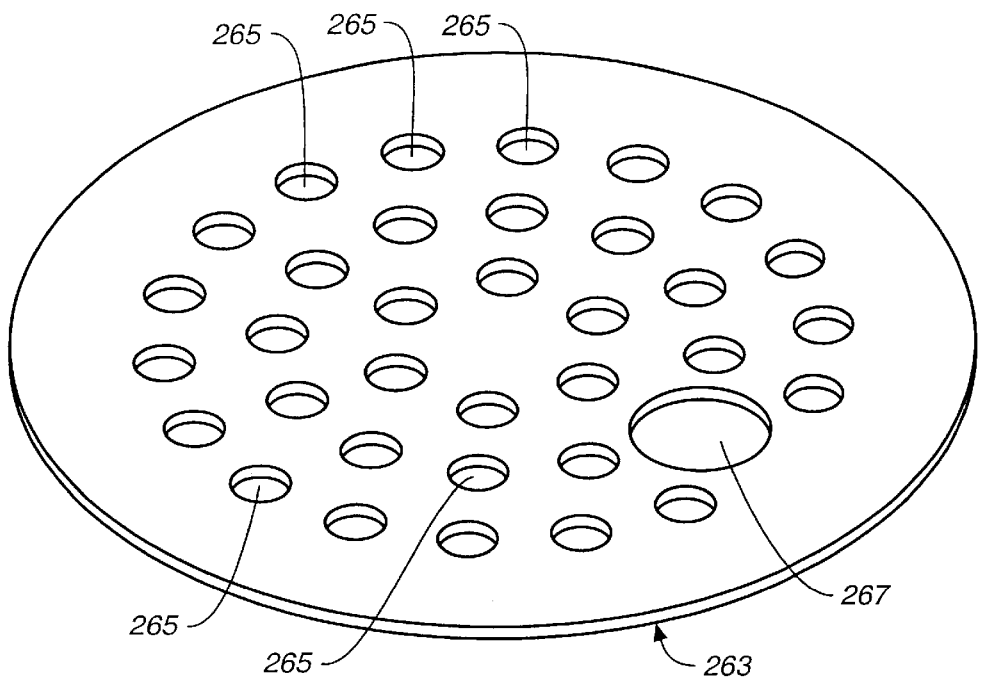
FIG._9B
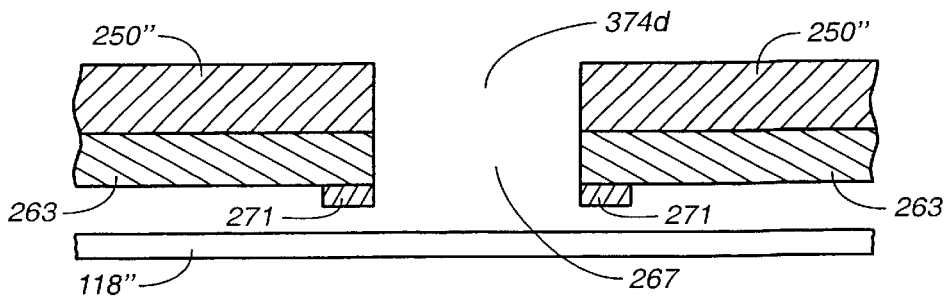
FIG._11A
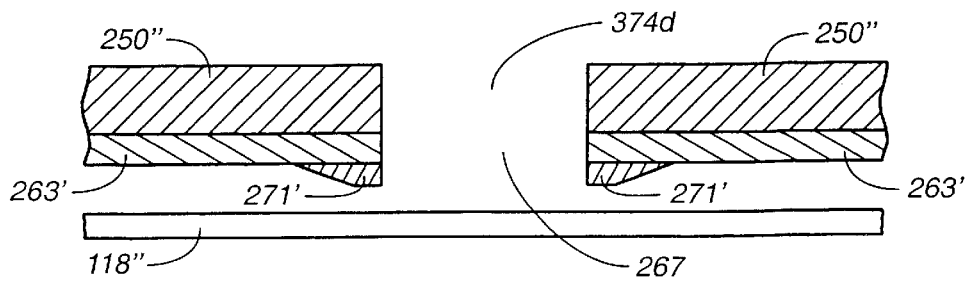
FIG._11B

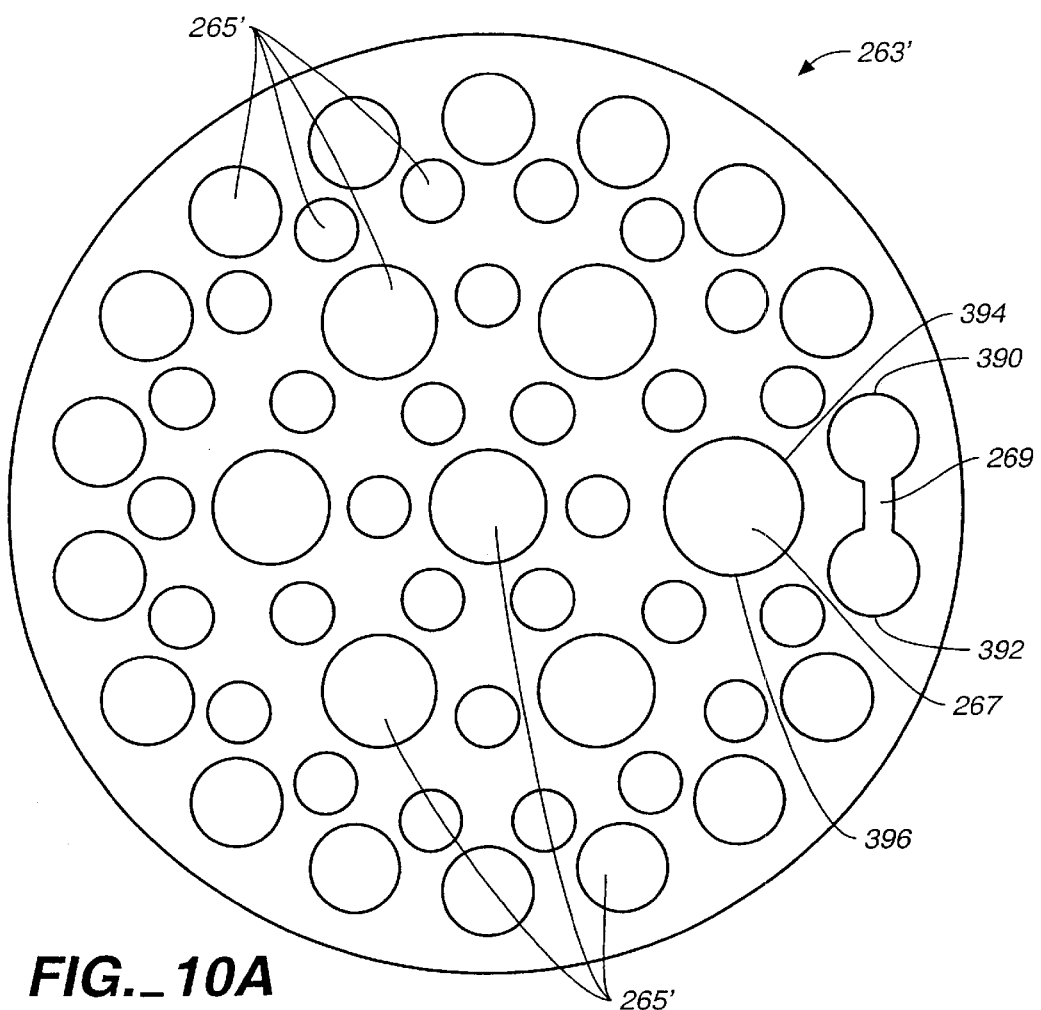
FIG._10A

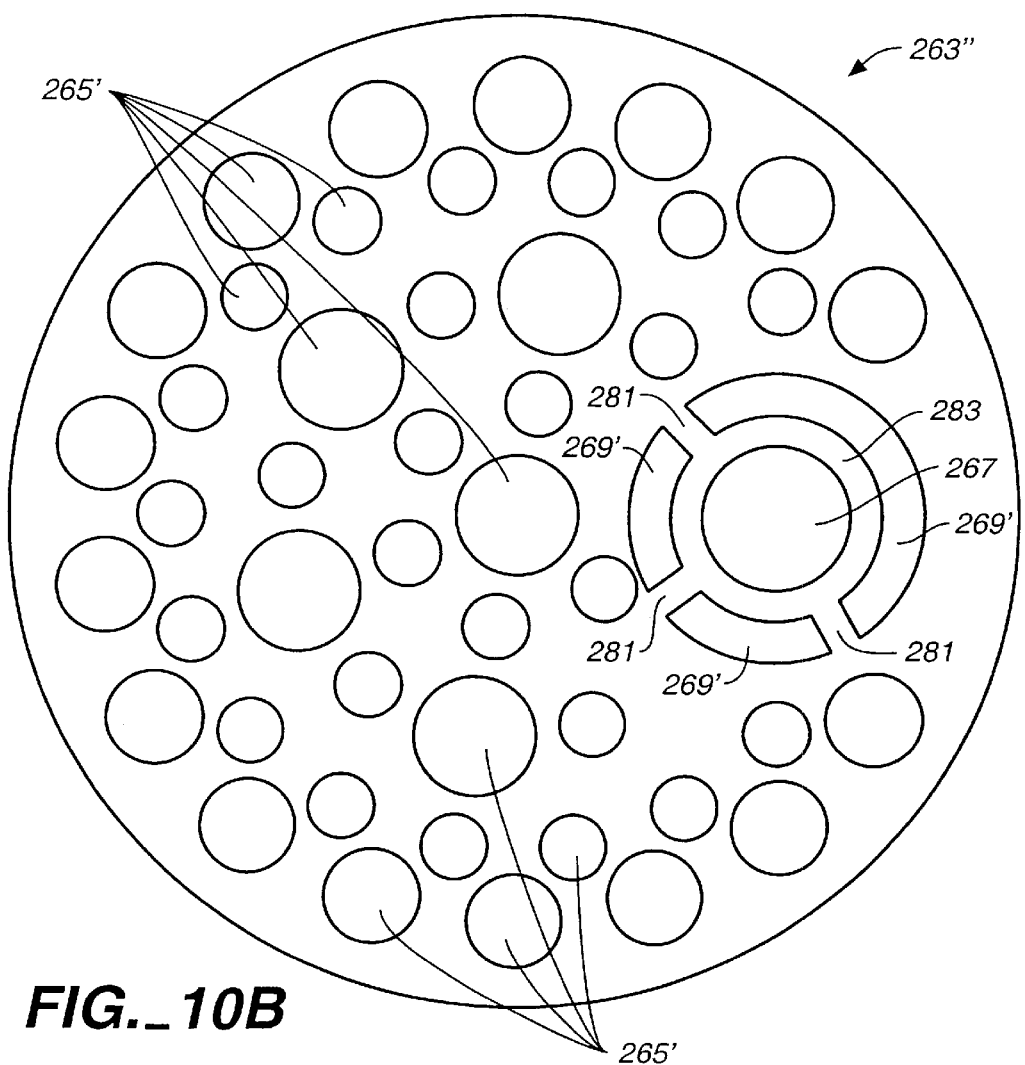
FIG._10B

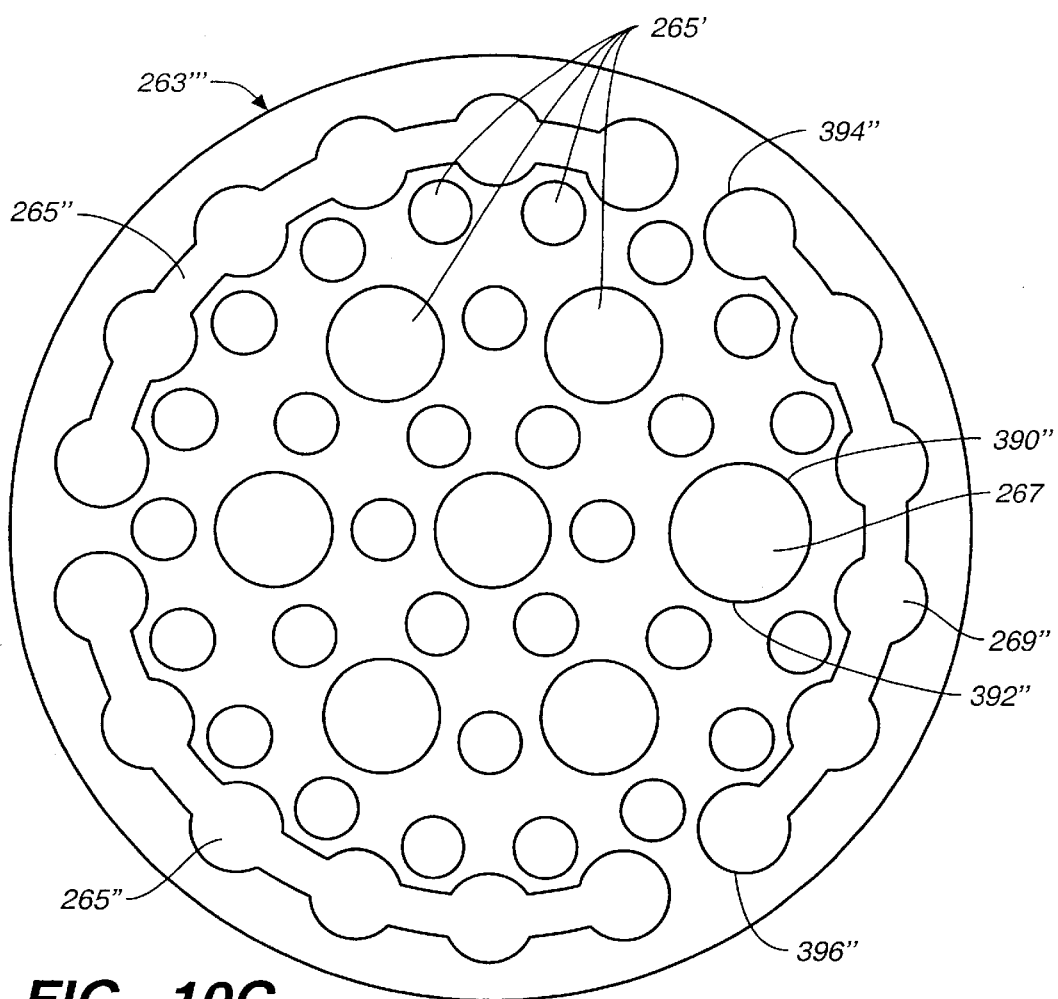
FIG._10C

CARRIER HEAD WITH A SUBSTRATE SENSOR

CROSS-REFERENCE TO RELATED APPLICATIONS

This is a divisional application based on Ser. No. 09/296,942, filed Apr. 22, 1999, now U.S. Pat. No. 6,398,621 which is a continuation-in-part application of Ser. No. 08/862,350, filed May 23, 1997, now U.S. Pat. No. 5,957,751 the entire disclosures of which are incorporated herein by reference.

BACKGROUND

The present invention relates generally to chemical mechanical polishing of substrates, and more particularly to methods and apparatus for detecting the presence of a substrate in a carrier head of a chemical mechanical polishing system.

Integrated circuits are typically formed on substrates, particularly silicon wafers, by the sequential deposition of conductive, semiconductive or insulative layers. After each layer is deposited, the layer is etched to create circuitry features. As a series of layers are sequentially deposited and etched, the outer or uppermost surface of the substrate, i.e., the exposed surface of the substrate, becomes increasingly non-planar. Therefore, the substrate surface is periodically planarized surface to provide a substantially planar layer surface.

Chemical mechanical polishing (CMP) is one accepted method of planarization. This planarization method typically requires that the substrate be mounted to a carrier or polishing head. The exposed surface of the substrate is then placed against a rotating polishing pad. The carrier provides a controllable load, i.e., pressure, on the substrate to press it against the polishing pad. In addition, the carrier may rotate to affect the relative velocity distribution over the surface of the substrate. A polishing slurry, including an abrasive and at least one chemically-reactive agent, may be distributed over the polishing pad to provide an abrasive chemical solution at the interface between the pad and substrate.

Typically, the carrier head is used to remove the substrate from the polishing pad after the polishing process has been completed. The substrate is vacuum-chucked to the underside of the carrier head. When the carrier head is retracted, the substrate is lifted off the polishing pad.

One problem that has been encountered in CMP is that the substrate may not be lifted by the carrier head. For example, if the surface tension binding the substrate to the polishing pad is greater than the force binding the substrate on the carrier head, then the substrate will remain on the polishing pad when the carrier head retracts. Also, if a defective substrate fractures during polishing, then the carrier head may be unable to remove the fractured substrate from the polishing pad.

A related problem is that the attachment of the substrate to the carrier head may fail, and the substrate may detach from the carrier head. This may occur if, for example, the substrate was attached to the carrier head by surface tension alone, rather than in combination with vacuum-chucking.

As such, an operator may not know that the carrier head no longer carries the substrate. The CMP apparatus will continue to operate even though the substrate is no longer present in the carrier head. This may decrease throughput. In addition, a loose substrate, i.e., one not attached to a carrier head, may be knocked about by the moving components of the CMP apparatus, potentially damaging the substrate or the polishing pad, or leaving debris which may damage other substrates.

Another problem encountered in CMP is the difficulty of determining whether the substrate is present in the carrier head. Because the substrate is located beneath the carrier head, it is difficult to determine by visual inspection whether the substrate is present in and properly attached to the carrier head. In addition, optical detection techniques are impeded by the presence of slurry.

A carrier head may include a rigid base having a bottom surface which serves as a substrate receiving surface. Multiple channels extend through the base to the substrate receiving surface. A pump or vacuum source can apply a vacuum to the channels. When air is pumped out of the channels, the substrate will be vacuum-chucked to the bottom surface of the base. A pressure sensor may be connected to a pressure line between the vacuum source and the channels in the carrier head. If the substrate was not successfully vacuum-chucked to the carrier head, then the channels will be open and air or other fluid will leak into the channels. On the other hand, if the substrate was successfully vacuum-chucked to the carrier head, then the channels will be sealed and air will not leak into the channels. Consequently, the pressure sensor will measure a higher vacuum or lower pressure when the substrate is successfully vacuum-chucked to the underside of the carrier head as compared to when the substrate is not properly attached to the carrier head.

Unfortunately, there are several problems with this method of detecting the presence of a substrate in the carrier head. Corrosive slurry may be suctioned into the channels and contaminate the carrier head. In addition, the threshold pressure for determining whether the substrate has been lifted from the polishing pad must be determined experimentally.

Accordingly, it would be useful to provide a CMP system capable of reliably sensing the presence of a substrate in a carrier head. It would also be useful if such a system could operate without exposing the interior of the carrier head to contamination by a slurry.

SUMMARY

In one aspect, the invention is directed to a carrier head that has a base, a flexible member connected to the base defining a first chamber, and a support pad positioned between the base and the flexible member. A lower face of the flexible member provides a substrate receiving surface, and the support pad has a plurality of apertures which cooperate with the flexible member to provide a plurality of pockets to trap a fluid that may be located between a substrate and the flexible member as a result of a substrate attachment procedure.

Implementations of the invention may include the following features. A valve in the carrier head may open or close a passage in the carrier head. The plurality of apertures may include a sensor aperture positioned below the valve so that the flexible member can deflect into the sensor aperture to actuate the valve if a fluid is evacuated from the first chamber and the substrate is not attached to the substrate receiving surface. A support plate may be positioned between the support pad and the base, and the sensor aperture may be located below a corresponding aperture in the support plate. A guardian aperture may be positioned between an edge of the support pad and the sensor aperture to prevent the fluid from traveling directly from the edge of the an annular aperture substantially enclosing the sensor aperture. An annular wall may extend from the support pad towards the first flexible member about the sensor aperture.

The wall may be substantially perpendicular to, or it may slope away from, a surface of the support pad. The plurality of apertures in the support pad may occupy a majority of a surface area of the support pad. The apertures may be of different sizes, or a uniform size. The carrier head may include a port fluidly coupled to the first chamber, and a pump may be coupled to the port to vary a pressure level in the first chamber. A support plate having a plurality of apertures may be positioned between the base and the support pad.

In another aspect, the invention is directed to a carrier head that has a base, a flexible member joined to the base to define a first chamber and a substrate receiving surface, and a support pad positioned between the base and the flexible member. The support pad includes a sensor aperture and a plurality of apertures extending about the sensor aperture to provide a plurality of pockets to trap a fluid which may be present between a substrate and the flexible member as a result of a substrate attachment procedure.

In another aspect, the invention is directed to a support pad for a carrier head that includes a flexible member which defines a substrate receiving surface. The support pad has a sensor aperture and a plurality of apertures extending about the sensor aperture to provide a plurality of pockets to trap a fluid which may be present between a substrate and the flexible member as a result of a substrate attachment procedure.

In another aspect, the invention is directed to a carrier head that has a base, a flexible member connected to the base to define a first chamber and a substrate receiving surface, a support pad positioned between the base and the flexible member, and a guardian member extending downward from the support pad. The support pad has a sensor aperture, and the guarding member forms a wall around the sensor aperture to block a fluid that can be trapped between the substrate and the flexible member during a substrate attachment procedure from entering the sensor aperture.

In another aspect, the invention is directed to a carrier head that has a base, a flexible member joined to the base to define a chamber and a substrate receiving surface, and a support plate positioned between the base and the flexible member. The support plate includes a sensor aperture and a plurality of apertures extending about the sensor aperture to provide a plurality of pockets to trap a fluid which may be present between a substrate and the flexible member as a result of a substrate attachment procedure.

In yet another aspect, the invention is directed to a carrier head that has a flexible membrane with a substrate receiving surface, a rigid body having an aperture into which the flexible membrane deflects if a chamber is evacuated and the substrate is not attached to the substrate receiving surface, and a barrier on the rigid body to prevent fluid that may be located between the substrate and the flexible membrane from causing the flexible membrane to deflect into the aperture when the substrate is attached to the substrate receiving surface.

Implementations of the invention may include the following features. The barrier may include a region into which the flexible membrane can expand to provide a fluid pocket. For example, the barrier may include a support pad having a plurality of apertures therethrough secured to a bottom surface of the body, or a plurality of recesses formed in a bottom surface of the body. The barrier may include a baffle joined to a bottom surface of the body.

In still another aspect, the invention is directed to a carrier head having a flexible membrane with a substrate receiving surface, a substrate detection mechanism, and means for preventing fluid that may be located between the substrate and the flexible membrane from interfering with the substrate detection mechanism.

In even another aspect, the invention is directed to a carrier head that has a base and a transparent flexible member connected to the base to provide a pressurizable chamber and a substrate receiving surface.

Implementations of the invention may include the following features. The flexible membrane may be formed of a silicone that does not contain pigmentation. A support structure may be positioned between the base and the flexible membrane, and a valve may be positioned on a lower surface of the base. The support structure may have an aperture therethrough which is aligned with the valve, and alignment of the valve with the aperture may be viewable through the transparent membrane.

Advantages of the invention include the following. The CMP apparatus includes a sensor to detect whether the substrate is properly attached to the carrier head. The sensor is less prone to false alarms.

Other advantages and features of the invention become apparent from the following description, including the drawings and claims.

BRIEF DESCRIPTION OF THE DRAWINGS

FIG. 1 is an exploded perspective view of a chemical mechanical polishing apparatus.

FIG. 2 is a schematic top view of a carousel, with the upper housing removed.

FIG. 3 is partially a cross-sectional view of the carousel of FIG. 2 along line 3—3, and partially a schematic diagram of the pressure regulators used by the CMP apparatus.

FIG. 4 is a schematic cross-sectional view of a carrier head with a flexible membrane and a chamber.

FIG. 5A is a schematic cross-sectional view of a carrier head with a vented chamber.

FIG. 5B is a view of the carrier head of FIG. 5A without an attached substrate.

FIG. 6A is a schematic cross-sectional view of a carrier head with a valve connecting the chamber to a bladder.

FIG. 6B is a view of the carrier head of FIG. 6A without an attached substrate.

FIG. 7 is a schematic cross-sectional view of a carrier head with a valve connecting the chamber to ambient atmosphere in accordance with the present invention.

FIGS. 8A and 8G are graphs showing pressure as a function of time in a CMP apparatus using the carrier head of FIG. 4.

FIGS. 8B and 8C are graphs showing pressure as a function of time in a CMP apparatus using the carrier head of FIG. 5A.

FIGS. 8D and 8E are graphs showing pressure as a function of time in a CMP apparatus using the carrier head of FIG. 6A.

FIG. 8F is a graph showing pressure as a function of time in a CMP apparatus using the carrier head of FIG. 7.

FIG. 9A is a schematic cross-sectional view of a support plate, a support pad and a flexible membrane.

FIG. 9B is a schematic perspective view of the support pad of FIG. 9A.

FIG. 9C is a schematic cross-sectional view illustrating the extension of the flexible membrane into the aperture in the support pad.

FIGS. 10A–10C are schematic top views of support pads with a plurality of apertures, a guardian aperture and a sensor aperture.

FIGS. 11A and 11B are schematic cross-sectional views of support pads with an annular guard member extending downward around the edges of a sensor aperture.

Like reference numbers are designated in the various drawings to indicate like elements. A letter suffix or a primed reference number indicates that an element has a modified function, operation or structure, or to differentiate elements in the same embodiment.

DETAILED DESCRIPTION

Referring to FIG. 1, one or more substrates 10 will be polished by a chemical mechanical polishing (CMP) apparatus 20. A complete description of CMP apparatus 20 may be found in pending U.S. Pat. No. 5,738,574, the entire disclosure of which is hereby incorporated by reference.

CMP apparatus 20 includes a lower machine base 22 with a table top 23 mounted thereon and a removable upper outer cover (not shown). Table top 23 supports a series of polishing stations 25, and a transfer station 27. Transfer station 27 may form a generally square arrangement with the three polishing stations. Transfer station 27 serves multiple functions of receiving individual substrates 10 from a loading apparatus (not shown), washing the substrates, loading the substrates into carrier heads (to be described below), receiving the substrates from the carrier heads, washing the substrates again, and finally transferring the substrates back to the loading apparatus.

Each polishing station 25 includes a rotatable platen 30 on which is placed a polishing pad 32. If substrate 10 is an eight-inch (200 mm) diameter disk, then platen 30 and polishing pad 32 will be about twenty inches in diameter. Platen 30 may be connected by a platen drive shaft (not shown) to a platen drive motor (also not shown). For most polishing processes, the drive motor rotates platen 30 at about thirty to two-hundred revolutions per minute, although lower or higher rotational speeds may be used.

Each polishing station may further include an associated pad conditioner apparatus 40. Each pad conditioner apparatus 40 has a rotatable arm 42 holding an independently rotating conditioner head 44 and an associated washing basin 46. The conditioner apparatus maintains the condition of the polishing pad so that it will effectively polish any substrate pressed against it while it is rotating.

A slurry 50 containing a reactive agent (e.g., deionized water for oxide polishing), abrasive particles (e.g., silicon dioxide for oxide polishing) and a chemically-reactive catalyzer (e.g., potassium hydroxide for oxide polishing), is supplied to the surface of polishing pad 32 by a combined slurry/rinse arm 52. Sufficient slurry is provided to cover and wet the entire polishing pad 32. Slurry/rinse arm 52 includes several spray nozzles (not shown) which provide a high pressure rinse of polishing pad 32 at the end of each polishing and conditioning cycle.

Two or more intermediate washing stations 55a and 55b may be positioned between neighboring polishing stations. The washing stations rinse the substrates as they pass from one polishing station to another.

A rotatable multi-head carousel 60 is positioned above lower machine base 22. Carousel 60 is supported by a center post 62 and rotated thereon about a carousel axis 64 by a carousel motor assembly located within base 22. Center post 62 supports a carousel support plate 66 and a cover 68.

Multi-head carousel 60 includes four carrier head systems 70. Three of the carrier head systems receive and hold substrates and polish them by pressing them against the polishing pad 32 on platen 30 of polishing stations 25. One of the carrier head systems receives a substrate from and delivers the substrate to transfer station 27.

The four carrier head systems are mounted on carousel support plate 66 at equal angular intervals about carousel axis 64. Center post 62 allows the carousel motor to rotate the carousel support plate 66 and to orbit the carrier head systems, and the substrates attached thereto, about carousel axis 64.

Each carrier head system 70 includes a polishing or carrier head 100. Each carrier head 100 independently rotates about its own axis, and independently laterally oscillates in a radial slot 72 formed in carousel support plate 66. A carrier drive shaft 74 connects a carrier head rotation motor 76 to carrier head 100 (shown by the removal of one-quarter of cover 68). There is one carrier drive shaft and motor for each head.

Referring to FIG. 2, in which cover 68 of carousel 60 has been removed, carousel support plate 66 supports the four carrier head systems. Carousel support plate includes four radial slots 72, generally extending radially and oriented 90° apart. Radial slots 72 may either be close-ended (as shown) or open-ended. The top of support plate supports four slotted carrier head support slides 80. Each slide 80 aligns along one of the radial slots 72 and moves freely along a radial path with respect to carousel support plate 66. Two linear bearing assemblies bracket each radial slot 72 to support each slide 80.

As shown in FIGS. 2 and 3, each linear bearing assembly includes a rail 82 fixed to carousel support plate 66, and two hands 83 (only one of which is illustrated in FIG. 3) fixed to slide 80 to grasp the rail. Two bearings 84 separate each hand 83 from rail 82 to provide free and smooth movement therebetween. Thus, the linear bearing assemblies permit slides 80 to move freely along radial slots 72.

A bearing stop 85 anchored to the outer end of one of the rails 82 prevents slide 80 from accidentally coming off the end of the rails. One of the aims of each slide 80 contains an unillustrated threaded receiving cavity or nut fixed to the slide near its distal end. The threaded cavity or nut receives a worm-gear lead screw 86 driven by a slide radial oscillator motor 87 mounted on carousel support plate 66. When motor 87 turns lead screw 86, slide 80 moves radially. The four motors 87 are independently operable to independently move the four slides along the radial slots 72 in carousel support plate 66.

A carrier head assembly or system, each including a carrier head 100, a carrier drive shaft 74, a carrier motor 76, and a surrounding non-rotating shaft housing 78, is fixed to each of the four slides. Drive shaft housing 78 holds drive shaft 74 by paired sets of lower ring bearings 88 and a set of upper ring bearings 89.

A rotary coupling 90 at the top of drive motor 76 couples three or more fluid lines 92a, 92b and 92c to three or more channels 94a, 94b and 94c, respectively, in drive shaft 74. Three vacuum or pressure sources, such as pumps, venturis or pressure regulators (hereinafter collectively referred to simply as "pumps") 93a, 93b and 93c may be connected to fluid lines 92a, 92b and 92c, respectively. Three pressure sensors or gauges 96a, 96b and 96c may be connected to fluid lines 92a, 92b and 92c, respectively. Controllable valves 98a, 98b and 98c may be connected across the fluid lines between pressure gauges 96a, 96b and 96c, and pumps 93a, 93b and 93c, respectively. Pumps 93a–93c, pressure gauges 96a–96c and valves 98a–98c may be appropriately connected to a general-purpose digital computer 99. Computer 99 may operate pumps 93a–93c, as described in more detail below, to pneumatically power carrier head 100 and to vacuum-chuck a substrate to the bottom of the carrier head. In addition, computer 99 may operate valves 98a–98c and monitor pressure gauges 96a–96c, as described in more detail below, to sense the presence of the substrate in the carrier head. In the various embodiments of the carrier head described below, the pumps remain coupled to the same fluid lines, although the function or purpose of the pumps may change.

During actual polishing, three of the carrier heads are positioned at and above respective polishing stations. Each carrier head lowers a substrate into contact with polishing pad 32, and slurry 50 acts as the media for chemical mechanical polishing of the substrate or wafer.

Generally, carrier head 100 holds the substrate against the polishing pad and evenly distributes a force across the back surface of the substrate. The carrier head also transfers torque from the drive shaft to the substrate and ensures that the substrate does not slip from beneath the carrier head during polishing.

Referring to FIG. 4, carrier head 100 includes a housing 102, a base 104, a gimbal mechanism 106, a loading mechanism 108, a retaining ring 110, and a substrate backing assembly 112. A more detailed description of a similar carrier head may be found in pending U.S. patent application Ser. No. 08/861,260 by Zuniga, et al., filed May 21, 1997, now U.S. Pat. No. 6,183,354 entitled A CARRIER HEAD WITH A FLEXIBLE MEMBRANE FOR A CHEMICAL MECHANICAL POLISHING SYSTEM, and assigned to the assignee of the present invention, the entire disclosure of which is hereby incorporated by reference.

The housing 102 is connected to drive shaft 74 to rotate therewith about an axis of rotation 107 which is substantially perpendicular to the surface of the polishing pad. The loading mechanism 108 is positioned between housing 102 and base 104 to apply a load, i.e., a downward pressure, to base 104. The vertical position of base 104 relative to polishing pad 32 is also controlled by loading mechanism 108. Pressurization of a chamber 290 positioned between base 104 and substrate backing assembly 112 generates an upward force on the base and a downward force on the substrate backing assembly. The downward force on the substrate backing assembly presses the substrate against the polishing pad.

The substrate backing assembly 112 includes a support structure 114, a flexure 116 connected between support structure 114 and base 104, and a flexible membrane 118 connected to support structure 114. The flexible membrane 118 extends below support structure 114 to provide a mounting surface 274 for the substrate. Each of these elements will be explained in greater detail below.

Housing 102 is generally circular in shape to correspond to the circular configuration of a substrate to be polished. The housing includes an annular housing plate 120 and a generally-cylindrical housing hub 122. Housing hub 122 may include an upper hub portion 124 and a lower hub portion 126. The lower hub portion may have a smaller diameter than the upper hub portion. The housing plate 120 may surround lower hub portion 126 and be affixed to upper hub portion 124 by bolts 128.

An annular cushion 121 may be attached, for example, by an adhesive, to an upper surface 123 of housing plate 120.

As discussed below, the cushion acts as a soft stop to limit the downward travel of base 104.

Base 104 is a generally ring-shaped body located beneath housing 102. A lower surface 150 of base 104 includes an annular recess 154. A passage 156 may connect a top surface 152 of base 104 to annular recess 154. A fixture 174 may be inserted into passage 152, and a flexible tube (not shown) may connect fixture 133 to fixture 174. The base 104 may be formed of a rigid material such as aluminum, stainless steel or fiber-reinforced plastic.

A bladder 160 may be attached to lower surface 150 of base 104. Bladder 160 may include a membrane 162 and a clamp ring 166. Membrane 162 may be a thin annular sheet of a flexible material, such as a silicone rubber, having protruding edges 164. The clamp ring 166 may be an annular body having a T-shaped cross-section and including wings 167. A plurality of tapped holes, spaced at equal angular intervals, are located in the upper surface of the clamp ring. The holes may hold bolts or screws to secure the clamp ring to the base. To assemble bladder 160, protruding edges 164 of membrane 162 are fit above wings 167 of clamp ring 166. The entire assembly is placed in annular recess 154. Clamp ring 166 may be secured to base 104 by screws 168 (not shown in FIG. 4, but one screw is shown on the left hand side of the cross-sectional view of FIG. 6A). Clamp ring 166 seals membrane 162 to base 104 to define a volume 170. A vertical passage 172 extends through clamp ring 166 and is aligned with passage 152 in base 104. An O-ring 178 may be used to seal the connection between passage 156 and passage 172.

Pump 93b (see FIG. 3) may be connected to bladder 160 via fluid line 92b, rotary coupling 90, channel 94b in drive shaft 74, passage 132 in housing 102, the flexible tube (not shown), passage 152 in base 104, and passage 172 in clamp ring 166. If pump 93b forces a fluid, for example a gas, such as air, into volume 170, then bladder 160 will expand downwardly. On the other hand, if pump 93b evacuates fluid from volume 170, then bladder 160 will contract. As discussed below, bladder 160 may be used to apply a downward pressure to support structure 114 and flexible membrane 118.

Gimbal mechanism 106 permits base 104 to move with respect to housing 102 so that the base may remain substantially parallel with the surface of the polishing pad. Gimbal mechanism 106 includes a gimbal rod 180 and a flexure ring 182. The upper end of gimbal rod 180 fits into a passage 188 through cylindrical bushing 142. The lower end of gimbal rod 180 includes an annular flange 184 which is secured to an inner portion of flexure ring 182 by, for example, screws 187. The outer portion of flexure ring 182 is secured to base 104 by, for example, screws 185 (not shown in FIG. 4, but one screw is shown in the left hand side of the cross-sectional view of FIG. 6A). Gimbal rod 180 may slide vertically along passage 188 so that base 104 may move vertically with respect to housing 102. However, gimbal rod 180 prevents any lateral motion of base 104 with respect to housing 102.

Gimbal mechanism 106 may also include a vertical passage 196 formed along the central axis of gimbal rod 180. Passage 196 connects upper surface 134 of housing hub 122 to chamber 290. O-rings 198 may be set into recesses in bushing 142 to provide a seal between gimbal rod 180 and bushing 142.

The vertical position of base 104 relative to housing 102 is controlled by loading mechanism 108. The loading mechanism includes a chamber 200 located between housing 102 and base 104. Chamber 200 is formed by sealing base 104 to housing 102. The seal includes a diaphragm 202, an inner clamp ring 204, and an outer clamp ring 206. Diaphragm 202, which may be formed of a sixty mil thick silicone sheet, is generally ring-shaped, with a flat middle section and protruding edges.

Inner clamp ring 204 is used to seal diaphragm 202 to housing 102. Inner clamp ring 204 is secured to base 104, for example, by bolts 218, to firmly hold the inner edge of diaphragm 202 against housing 102.

Outer clamp ring 206 is used to seal diaphragm 202 to base 104. Outer clamp ring 206 is secured to base 104, for example, by bolts (not shown), to hold the outer edge of diaphragm 202 against the top surface of base 104. Thus, the space between housing 102 and base 104 is sealed to form chamber 200.

Pump 93a (see FIG. 3) may be connected to chamber 200 via fluid line 92a, rotary coupling 90, channel 94a in drive shaft 74, and passage 130 in housing 102. Fluid, for example a gas, such as air, is pumped into and out of chamber 200 to control the load applied to base 104. If pump 93a pumps fluid into chamber 200, the volume of the chamber will increase and base 104 will be pushed downwardly. On the other hand, if pump 93a pumps fluid out of chamber 200, the volume of chamber 200 will decrease and base 104 will be pulled upwardly.

Outer clamp ring 206 also includes an inwardly projecting flange 216 which extends over housing 102. When chamber 200 is pressured and base 104 moves downwardly, inwardly projecting flange 216 of outer clamp ring 206 abuts cushion 121 to prevent over-extension of the carrier head. Inwardly projecting flange 216 also acts as a shield to prevent slurry from contaminating components, such as diaphragm 202, in the carrier head.

Retaining ring 110 may be secured at the outer edge of base 104. Retaining ring 110 is a generally annular ring having a substantially flat bottom surface 230. When fluid is pumped into chamber 200 and base 104 is pushed downwardly, retaining ring 110 is also pushed downwardly to apply a load to polishing pad 32. An inner surface 232 of retaining ring 110 defines, in conjunction with mounting surface 274 of flexible membrane 118, a substrate receiving recess 234. The retaining ring 110 prevents the substrate from escaping the receiving recess and transfers the lateral load from the substrate to the base.

Retaining ring 110 may be made of a hard plastic or a ceramic material. Retaining ring 110 may be secured to base 104 by, for example, bolts 240 (only one is shown in this cross-sectional view).

The substrate backing assembly 112 is located below base 104. Substrate backing assembly 112 includes support structure 114, flexure 116 and flexible membrane 118. The flexible membrane 118 connects to and extends beneath support structure 114.

Support structure 114 includes a support plate 250, an annular lower clamp 280, and an annular upper clamp 282. Support plate 250 may be a generally disk-shaped rigid member. Support plate 250 may have a generally planar lower surface 256 with a downwardly-projecting lip 258 at its outer edge. A plurality of apertures 260 may extend vertically through support plate 250 connecting lower surface 256 to an upper surface 254. An annular groove 262 may be formed in upper surface 254 near the edge of the support plate. Support plate 250 may be formed of aluminum or stainless steel. A support pad 263 (not shown), having a plurality of apertures 265 and a sensor aperture 267, may be attached to lower surface 256 of the support plate to serve as a cushion between the support plate and the substrate.

Flexible membrane 118 is a circular sheet formed of a flexible and elastic material, such as a high-strength silicone rubber. Membrane 118 may have a protruding outer edge 270. A portion 272 of membrane 118 extends around a lower corner of support plate 250 at lip 258, upwardly around an outer cylindrical surface 268 of the support plate, and inwardly along upper surface 254. Protruding edge 270 of membrane 118 may fit into groove 262. The edge of flexible membrane 118 is clamped between lower clamp 280 and support plate 250. A small aperture or plurality of apertures may be formed at the approximate center of membrane 118. The apertures may be about one to ten millimeters across, and are used, as discussed below, to sense the presence of the substrate.

The flexure 116 is a generally planar annular ring. Flexure 116 is flexible in the vertical direction, and may be flexible or rigid in the radial and tangential directions. The material of flexure 116 is selected to have a durometer measurement between 30 on the Shore A scale and 70 on the Shore D scale. The material of flexure 116 may be a rubber such as neoprene, an elastomeric-coated fabric such as NYLON™ or NOMEX™, a plastic, or a composite material such as fiberglass or silicone.

The space between flexible membrane 118, support structure 114, flexure 116, base 104, and gimbal mechanism 106 defines chamber 290. Passage 196 through gimbal rod 180 connects chamber 290 to the upper surface of housing 102. Pump 93c (see FIG. 3) may be connected to chamber 290 via fluid line 92c, rotary coupling 90, channel 94c in drive shaft 74 and passage 196 in gimbal rod 180. If pump 93c forces a fluid, for example a gas, such as air, into chamber 290, then the volume of the chamber will increase and flexible membrane 118 will be forced downwardly. On the other hand, if pump 93c evacuates air from chamber 290, then the volume of the chamber will decrease and the membrane will be forced upwardly. It is advantageous to use a gas rather than a liquid because a gas is more compressible.

The lower surface of flexible membrane 118 provides a mounting surface 274. During polishing, substrate 10 is positioned in substrate receiving recess 234 with the backside of the substrate positioned against the mounting surface. The edge of the substrate may contact the raised lip 258 of support ring 114 through flexible membrane 118.

By pumping fluid out of chamber 290, the center of flexible membrane 118 may be bowed inwardly and pulled above lip 258. If the backside of the substrate is placed against mounting surface 274, then the extension of the flexible membrane above lip 258 creates a low-pressure pocket 278 between the substrate and the flexible membrane (see FIGS. 5A and 6A). This low-pressure pocket vacuum-chucks the substrate to the carrier head.

A CMP apparatus utilizing carrier head 100 may operate as follows. Substrate 10 is loaded into substrate receiving recess 234 with the backside of the substrate abutting mounting surface 274 of flexible membrane 118. Pump 93b pumps fluid into bladder 160. This causes bladder 160 to expand and force support structure 114 downwardly. The downward motion of support structure 114 causes lip 258 to press the edge of flexible membrane 118 against the edge of substrate 10, creating a fluid-tight seal at the edge of the substrate. Then pump 93c evacuates chamber 290 to create a low-pressure pocket between flexible membrane 118 and the backside of substrate 10 as previously described. Finally, pump 93a pumps fluid out of chamber 200 to lift base 104, substrate backing assembly 112, and substrate 10 off a polishing pad or out of the transfer station. Carousel 60 then, for example, rotates the carrier head to a polishing station. Pump 93a then forces a fluid into chamber 200 to lower the substrate 10 onto the polishing pad. Pump 93b evacuates volume 170 so that bladder 160 no longer applies a downward pressure to support structure 114 and flexible membrane 118. Finally, pump 93c may pump a gas into chamber 290 to apply a downward load to substrate 10 for the polishing step.

The CMP apparatus of the present invention is capable of detecting whether a substrate is properly attached to carrier head 100. If the CMP apparatus detects that the substrate is missing or is improperly attached to the carrier head, the operator may be alerted and polishing operations may be automatically halted.

The CMP apparatus may sense whether carrier head 100 successfully chucked the substrate as follows. After pump 93c evacuates chamber 290 to create low pressure pocket 278 between flexible membrane 118 and the backside of substrate 10, pressure gauge 96c is used to measure the pressure in chamber 290.

Referring to FIG. 8A, chamber 290 is initially at a pressure $P_{a1}$. Then pump 93c begins to evacuate chamber 290 at a time $T_{a0}$. On the one hand, if the substrate is properly attached to the carrier head, substrate 10 will block aperture 276 and pump 93c will successfully evacuate chamber 290. Consequently, the pressure in chamber 290 will fall to a pressure $P_{a2}$. If the substrate is not present or is not properly attached to the carrier head, then aperture 276 will not be blocked, and air from the ambient atmosphere will leak into chamber 290. Consequently, pump 93c will not be able to completely evacuate chamber 290, and the pressure in chamber 290 will only fall to a pressure $P_{a3}$ which is greater than pressure $P_{a2}$. The exact values of pressures $P_{a1}$, $P_{a2}$ and $P_{a3}$ depend upon the efficiency of pump 93c and the size of aperture 276 and chamber 290, and may be experimentally determined. Pressure gauge 96c measures the pressure in line 92c, and thus in chamber 290, at time $T_{a1}$ after the pump is activated. Computer 99 may be programmed to compare the pressure measured by pressure gauge 96c to a threshold pressure $P_{aT}$ which is between pressures $P_{a2}$ and $P_{a3}$. An appropriate threshold pressure $P_{aT}$ may be determined experimentally. If the pressure measured by gauge 96c is below threshold pressure $P_{aT}$ then it is assumed that the substrate is chucked to the carrier head and the polishing process may proceed. On the other hand, if the pressure measured by gauge 96c is above threshold pressure $P_{aT}$, this provides an indication that the substrate is not present or is not properly attached to the carrier head.

In the alternate embodiments of the carrier head of the present invention discussed below, elements with modified functions or operations will be referred to with single or double primed reference numbers. In addition, in the embodiments discussed below, although pressure sensors 96a–96c remain coupled to fluid lines 92a–92c, respectively, the purpose or function of the pressure sensors may change.

Referring to FIG. 5A, flexible membrane 118a of carrier head 100a does not include an aperture. Rather, carrier head 100a includes a vent 300 between chamber 290 and the ambient atmosphere.

Vent 300 includes a passageway 302 formed in flexure ring 182a, a passageway 304 formed in base 104a, and a passageway 306 formed in outer clamp ring 206a. Vent 300 may also include a check valve 308 to prevent fluid from exiting chamber 290. Check valve 308 may be located between base 104a and outer clamp ring 206a. During polishing, when pump 93c pressurizes chamber 290, the air pressure in passageway 304 will close check valve 308. This ensures that the pressure in chamber 290 remains constant.

Support plate 250a may include a large sensor aperture 320 located beneath an entry port 322 of passage 196. As discussed below, flexible membrane 118a may deflect upwardly through sensor aperture 320 to close entry port 322. In addition, a spacer (not shown) may be attached to the bottom surface of flexure ring 182. The spacer prevents direct contact between support plate 250 and flexure ring 182 and provides a gap for fluid to flow from passageway 302 to entry port 322.

A CMP apparatus using carrier head 100a senses whether the substrate has been successfully chucked to the carrier head as follows. The substrate is loaded into substrate receiving recess 234 so that the backside of the substrate contacts mounting surface 274. Pump 93c evacuates chamber 290 to create low-pressure pocket 278 between flexible membrane 118a and substrate 10. Pressure gauge 96c measures the pressure in chamber 290 to determine whether the substrate was successfully vacuum-chucked to the carrier head.

As shown in FIG. 5A, if the substrate was successfully vacuum-chucked, flexible membrane 118a is maintained in close proximity to substrate 10 by low-pressure pocket 278. Consequently, air may flow into chamber 290 through vent 300 as pump 93c attempts to evacuate chamber 290. As shown in FIG. 5B, if the substrate is not present or is not properly attached to the carrier head, then membrane 118a will deflect through sensor aperture 320 and be pulled against a lower surface 324 of gimbal rod 180 to close entry port 322 of passage 196.

Referring to FIG. 8B, chamber 290 is initially at a pressure $P_{b1}$. Pump 93c begins to evacuate chamber 290 at time $T_{b0}$. If the substrate is properly attached to the carrier head, then the pressure measured by gauge 96c will fall from pressure $P_{b1}$ to a pressure $P_{b2}$. If the substrate is not present or is improperly attached to the carrier head, then the pressure measured by gauge 96c will fall from pressure $P_{b1}$ to a pressure $P_{b3}$. Since air may leak into chamber 290 through vent 300 if the substrate is present, pressure $P_{b2}$ is greater than pressure $P_{b3}$.

Computer 99 may be programmed to compare the pressure measured by gauge 96c at time $T_{b1}$ after activation of pump 93c to a threshold pressure $P_{bT}$. If the pressure measured by gauge 96c is greater than the threshold pressure $P_{bT}$, it is assumed that the substrate is chucked to the carrier head and the polishing process may continue normally. On the other hand, if the pressure measured by gauge 96c is less than the threshold pressure $P_{bT}$, this is an indication that the substrate is not present or is not properly attached to the carrier head. Pressures $P_{b1}$, $P_{b2}$, $P_{b3}$ and $P_{bT}$ depend upon the efficiency of pump 93c, the size and shape of chamber 290, and the size and shape of vent 300, and may be determined experimentally.

In order for carrier head 100a to function properly, membrane 118a must deflect sufficiently to block entry port 322. The deflection of membrane 118a depends upon the diameter of sensor aperture 320, the vertical distance that membrane 118 needs to deflect, the elastic modulus and thickness of membrane 118a, and the vacuum level in chamber 290. Sensor aperture 320 may be about 1.25 inches in diameter, the distance between bottom surface 256 of support plate 250 and the bottom surface of flexure ring 182 may be about 120 to 140 mils, membrane 118a may have a thickness of 1/32 inch and a durometer measurement of about forty to forty-five on the Shore A scale, and the vacuum level in chamber 290 may be about twenty-two to twenty-four inches of mercury (inHg) when aperture 274 is blocked and about ten to fifteen inHg when the aperture is not blocked.

Referring to FIG. 8C, in an alternate method of operating a CMP apparatus including carrier head 100a, the pressure in volume 170 may be measured to determine whether the substrate was successfully chucked to the carrier head. If this alternate method is used, carrier head 100a need not have a vent 300. Volume 170 may initially be at a pressure $P_{c1}$, and valve 98b is closed to seal volume 170 from pressure regulator 93b. After pump 93c evacuates chamber 290 to create low pressure pocket 278 between flexible membrane 118 and the backside of substrate 10, pressure gauge 96b is used to measure the pressure in volume 170. As pump 93c evacuates chamber 290, support structure 114 is drawn upwardly. This causes annular upper ring 282 to press upwardly on membrane 162 and reduces the volume of bladder 160.

If substrate 10 is properly attached to carrier head 100a, the pressure in volume 170 will rise to a pressure $P_{c2}$. On the other hand, if the substrate is not present or is improperly attached to the carrier head, membrane 118a will deflect through sensor aperture 320 to close entry port 322 of passage 196. Consequently, some fluid will be trapped in chamber 290, and chamber 290 will not reach as low a pressure. Since support structure 114 will not be drawn as far upwardly and bladder 160 will not be as compressed, the pressure measured by gauge 96b will rise only to a pressure $P_{c3}$ which is less than pressure $P_{c2}$. If the pressure measured by gauge 96b is greater than a threshold pressure $P_{cT}$, it is assumed that the substrate is chucked to the carrier head and the polishing process may continue normally. On the other hand, if the pressure measured by gauge 96b is less than the threshold pressure $P_{cT}$, this is an indication that the substrate is not present or is not properly attached to the carrier head.

Referring to FIG. 6A, in another embodiment a mechanically actuated valve 350 is located between chamber 290 and volume 170. Valve 350 may be at least partially located in a chamber 366 formed across passage 156b between fixture 174 and bladder 160. Valve 350 includes a valve stem 352 and a valve press plate 356. Valve stem 352 may extend through an aperture 354 between chamber 366 and chamber 290 in flexure ring 182b. Valve press plate 356 is connected to the lower end of valve stem 352 and fits in a shallow depression 358 in a lower surface 360 of flexure ring 182b. Three channels 362 (only one channel is shown in the cross-sectional view of FIG. 6A) may be formed in flexure ring 182b surrounding aperture 354 and valve stem 352 to connect chamber 290 to chamber 366. Valve 350 may also include an annular flange 364 positioned above flexure rings 182b in chamber 366. An O-ring 368 may be positioned around valve stem 352 between annular flange 364 and flexure ring 182b. In addition, a spring 370 may be positioned between annular flange 364 and a ceiling 372 of chamber 366. Spring 370 biases valve stem 352 downwardly so valve 350 is closed. More specifically, O-ring 368 is compressed between annular flange 364 and flexure ring 182b to seal channels 362 from chamber 366, thereby isolating chamber 366 from chamber 290. However, if valve stem 352 is forced upwardly (as shown in FIG. 6B), then O-ring 368 will no longer be compressed and fluid may leak around the O-ring. As such, valve 350 will be open and chamber 366 and chamber 290 will be in fluid communication via channels 362.

Support plate 250b may include a generally circular sensor aperture 374 located beneath valve press plate 356. As discussed below, flexible membrane 118b may deflect upwardly through sensor aperture 374 to open valve 350.

A CMP apparatus including carrier head 100b senses whether the substrate has been successfully vacuum-chucked to the carrier head as follows. The substrate is positioned in the substrate receiving recess 234 so that the backside of the substrate contacts mounting surface 274. Pump 93b inflates bladder 160 to form a seal between flexible membrane 118b and substrate 10. Then valve 98b is closed to isolate bladder 160 from pump 93b. A first measurement of the pressure in volume 170 is made by means of pressure gauge 96b. Pump 93c evacuates chamber 290 to create low-pressure pocket 278 between the flexible membrane and the substrate. Then a second measurement of the pressure in volume 170 is made by means of pressure gauge 96b. The first and second pressure measurements may be compared to determine whether the substrate was successfully vacuum-chucked to the carrier head.

As shown in FIG. 6A, if the substrate was successfully vacuum-chucked, flexible membrane 118b is maintained in close proximity to substrate 10 by low pressure pocket 278, and valve 350 will remain in its closed position. On the other hand, as shown in FIG. 6B, if the substrate is not present or is improperly attached to the carrier head, then when chamber 290 is evacuated, flexible membrane 118b will deflect upwardly. The flexible membrane will thus contact valve press plate 356 and open valve 350, thereby fluidly connecting chamber 290 to chamber 366. This permits fluid to be drawn out of volume 170 through chamber 290 and evacuated by pump 93c.

Referring to FIG. 8D, volume 170 may initially be at a pressure $P_{d1}$. The first pressure measurement is made at time $T_{d1}$ before pump 93c begins to evacuate chamber 290. When chamber 290 is evacuated at time $T_{d1}$, support structure 114 is drawn upwardly. This causes annular upper ring 282 to press upwardly on membrane 162. This will reduce the volume of bladder 160. The second pressure measurement is made at time $T_{d2}$ after chamber 290 has been evacuated.

If the substrate is present, valve 350 remains closed, and the reduction of the volume of bladder 160 will thereby increase the pressure in volume 170 measured by gauge 96b as pressure $P_{d1}$. On the other hand, if the substrate is not present, then valve 350 is opened and fluid is evacuated from volume 170 so that the pressure measured by gauge 96b falls to pressure $P_{d3}$. Therefore, if the second measured pressure is larger than the first measured pressure, the substrate has been successfully chucked by the carrier head. However, if the second measured pressure is less than the first measured pressure, the substrate has not been successfully chucked by the carrier head.

Computer 99 may be programmed to store the two pressure measurements, compare the pressure measurements, and thereby determine whether the substrate was successfully vacuum-chucked to the carrier head.

In addition to the factors discussed previously with reference to carrier head 100a, the ability of membrane 118b to actuate valve 350 depends upon the diameter of valve press plate 356 and the downward load of spring 370 on valve stem 352 as well as the elasticity of membrane 118b. Sensor aperture 374 may be about 1.0 to 1.5 inches in diameter, spring 370 may apply a downward load of about two to three pounds, valve press plate 376 may be about the same size as aperture 374, the distance between bottom surface 256 of support plate 250 and the bottom surface of flexure ring 182 may be about 80 to 100 mils, and the vacuum level in chamber 290 may be about ten to fifteen inHg.

Referring to FIG. 8E, in an alternate method of operating a CMP apparatus including carrier head 100b, valve 98b may remain open when pump 93c evacuates chamber 290. Volume 170 may initially be at a pressure $P_{e1}$. The first pressure measurement is made at time $T_{e1}$ before pump 93c begins to evacuate chamber 290. The second pressure measurement is made at time $T_{e2}$ after pump 93c begins to evacuate chamber 290. If the substrate is present, valve 350 remains closed, and pressure regulator 93b will maintain the pressure in volume 170 at pressure $P_{e1}$. On the other hand, if the substrate is not present, valve 350 is opened. Pressure regulator 93b will be unable to maintain the pressure in volume in 170 as fluid is evacuated, and the pressure in volume 170 will fall to pressure $P_{e2}$. Therefore, if the second measured pressure is smaller than the first measured pressure, the substrate was not successfully chucked by the carrier head. However, if the second measured pressure is equal to the first measured pressure, the substrate is properly attached to the carrier head.

Carrier head 100b provides several benefits. First, carrier head 100b is a sealed system in which there are no leaks or apertures to the atmosphere. Therefore, it is difficult for slurry to contaminate the interior of the carrier head. In addition, carrier head 100b provides an absolute method of determining whether the substrate has been vacuum-chucked to the carrier head: if the pressure in volume 170 increases, the substrate is properly attached to the carrier head, whereas if the pressure in volume 170 decreases, the substrate is not present or is not properly attached to the carrier head. Experimentation is not required to determine a threshold pressure. In addition, because valve 350 is biased closed by spring 370, the valve only opens if chamber 290 is under vacuum and a substrate is not present or is improperly attached to the carrier head. Consequently, the wafer sensor mechanism is not sensitive to the sequence of pressure or vacuum states in chamber 290 and volume 170.

Referring to FIG. 7, in another embodiment, carrier head 100c include a mechanically actuated valve 350 connected across a passage 380 between chamber 290 and the ambient atmosphere. Valve 350 may be at least partially located in a chamber 366' formed across passage 380, and includes valve stem 352, valve press plate 356, and annular flange 364. In its closed position, valve 350' isolates chamber 366' from chamber 290. However, if valve stem 352 is forced upwardly (as shown in FIG. 6B), then O-ring 368 will no longer be compressed and fluid may leak around the O-ring. As such, valve 350 will be open and chamber 290 will be in fluid communication with the ambient atmosphere via passage 380.

A CMP apparatus including carrier head 100c senses whether the substrate has been successfully vacuum-chucked to the carrier head as follows. Referring to FIG. 8F, chamber 290 is initially at a pressure $P_{f1}$. Then pump 93c begins to evacuate chamber 290 at a time $T_{f0}$. If the substrate is present, valve 350 remains closed, and the pressure in chamber 290 as measured by gauge 96c will fall to a pressure $P_{f2}$. On the other hand, if the substrate is not present, then valve 350 is opened. Consequently, pump 93c will not be able to completely evacuate chamber 290, and the pressure in chamber 290 will only fall to a pressure $P_{f3}$ which is greater than pressure $P_{f2}$. Computer 99 may be programmed to compare the pressure measured by pressure gauge 96c to a threshold pressure $P_{ft}$ which is between pressures $P_{f2}$ and $P_{f3}$ to determine whether the substrate is present and properly attached to the carrier head.

As shown in FIG. 9A, a carrier head 100d includes a support pad 263 located between support plate 250d and flexible membrane 118d. The surface dimensions of the support pad and the support plate are substantially similar, e.g., the pad and plate may be circular and have the same diameter. The diameter of the support pad and the support plate may each be about 7.81 inches. The pad and the plate may be attached to each other, for example, by an adhesive. Carrier head 100d may be constructed similarly to carrier heads 100a, 100b or 100c, with a vent or an actuatable valve, and an aperture in the support plate in the corresponding location through which the flexible membrane deflects.

Referring to FIG. 9B, support pad 263 includes a plurality of apertures 265. As shown in FIG. 9C, apertures 265 provide indentations into which flexible membrane 118d can extend to provide a plurality of air pockets 273 between the flexible membrane and the substrate. In order to explain the advantages of air pockets 273, it should be noted that air can be trapped between the substrate and the flexible membrane as the substrate is vacuum-chucked to the carrier head. However, the pockets prevent air from accumulating between the substrate and the flexible membrane in the region of the sensor aperture 374d. Specifically, air that is captured between the flexible membrane and the substrate during the vacuum-chucking procedure tends to be trapped in the pockets, and does not reach the region of the sensor aperture. In addition, the pockets provide a surface "roughness" which slows the speed of air flow between the substrate and the flexible membrane. Consequently, any air between the membrane and substrate is less likely to cause the flexible membrane to extend into aperture sensor 374d and actuate the valve or block the entry port. Thus, the risk of a false alarm indicating that the substrate is not properly attached to the carrier head is reduced.

The apertures 265 may be of uniform size, e.g., they may have a diameter between about 0.5 and 1.0 inches. A larger sensor aperture 267 in the support pad is aligned with sensor aperture 374d. Sensor aperture 267 permits membrane 118d to extend through aperture 374d to actuate the valve (assuming carrier head 100d is constructed similarly to carrier head 100b) or block a passage (assuming carrier head 100d is constructed similarly to carrier head 100a).

Referring to FIG. 10A, in another embodiment, support pad 263' includes apertures 265' of varying sizes. The apertures may range in size from a diameter of about 0.5 inch to about 1.0 inch. The apertures provide a convoluted or circuitous path for air to flow between the edge of the support pad and the sensor aperture, thereby reducing the likelihood that air will reach the sensor aperture.

The support pad 263' further includes a guardian aperture 269 which is positioned between the sensor aperture and an edge of the support pad to block an air path from an edge of the support pad to the sensor aperture. Specifically, first and second edges 390 and 392 of guardian aperture 269 extend outward beyond first and second edges 394 and 396 of the sensor aperture and are substantially linearly aligned.

The guardian aperture may have other shapes as well. For example, as shown in FIG. 10B, support pad 263" may include an annular guardian aperture 269' that surrounds sensor aperture 267 to substantially completely block the air path to the sensor aperture. Support pad 263" includes a plurality of connecting pieces 281 to join an annular piece 283 to the remainder of the support pad.

Referring to FIG. 10C, the outermost ring of apertures of support pad 263'" are connected to form a plurality of elongated apertures 265'" and an elongated guardian aperture 269". These elongated apertures provide a greater total aperture volume to trap air and a more circuitous path for air to flow to the sensor aperture. First and second edges 390" and 392" of the guardian aperture extend beyond first and second edges 394 and 396 of the sensor aperture.

Referring to FIGS. 11A and 11B, air may also be prevented from triggering a false alarm by providing an annular guardian member 271 extending downward from the support pad and surrounding the sensor aperture. In other words, the guardian member forms a generally circular wall completely surrounding the sensor aperture. The guardian member prevents air bubbles between the substrate and flexible membrane from accumulating in the region of the sensor aperture. As shown in FIG. 11A, guardian member 271 may have walls which are generally perpendicular to the surface of the support pad. On the other hand, FIG. 11B shows an annular guardian member 271' which has a sloping wall. Annular guardian member 271 or 271' may be attached to the support pad by an adhesive or formed integrally with the support pad. The guardian member can be combined with any one of support pads 263, 263' or 263".

Substantially similar arrangements may be used in connection with the support plate. That is, apertures or indentations may be formed in the support plate to provide regions into which the flexible membrane can extend to provide air pockets. In addition, the guardian members may be formed on the support plate. In such arrangements, a support pad may be unnecessary.

In the above embodiments, the apertures should cover a majority portion of the surface area of the support pad or support plate. For example, the apertures should extend over approximately 50 percent of the available surface area of the support pad or support plate. In addition, the apertures should provide a convoluted or circuitous route for air flow between the edge of the substrate and the sensor aperture.

In any of the carrier heads 100a–100d, the flexible membrane may be transparent or semi-transparent. For example, the flexible membrane may be formed of a silicone that does not have any added pigmentation. The transparent flexible membrane is a particular advantage in carrier head 100c and 100d, because it permits the user to look through the membrane to determine whether the sensor aperture in the support structure is aligned with the valve press plate before the retaining ring is secured to the base. If the aperture and press plate are not properly aligned, the entire backing assembly can be rotated until they are aligned. Then the retaining ring can be secured to the base to hold the substrate backing assembly in place.

As discussed above, the CMP apparatus may detect whether the carrier head has successfully chucked the substrate. In addition, in any of the embodiments, the pressure gauges may also be used to continuously monitor the presence of a substrate in the carrier head. If pressure gauges 96c or 96b detect a change in the pressure of volume 170, for example, while transporting the substrate between polishing stations or between a polishing station and a transfer station, then this is an indication that the substrate has loosened or detached from the carrier head. In this circumstance, operations may be halted and the problem corrected.

Another problem that has been encountered in CMP is that the substrate may escape from the carrier head during polishing. For example, if the retaining ring accidentally lifts off the polishing pad, the frictional force from the polishing pad will slide the substrate out from beneath the carrier head.

A CMP apparatus using carrier head 100 may sense whether the substrate is properly positioned beneath the carrier head during polishing. If carrier head 100 is to be used in this fashion, it is advantageous to have several apertures 278 located near the periphery of the flexible membrane 118. When pump 93c pressurizes chamber 290 to apply a load to the substrate 10, pressure gauge 96c is used to measure the pressure in chamber 290. Referring to FIG. 8G, chamber 290 is initially at a pressure $P_{g1}$. If the substrate is properly positioned beneath the carrier head, substrate 10 will block apertures 278 and the pressure in chamber 290 will remain constant. However, if the substrate escapes, then apertures 278 will not be blocked, and fluid from chamber 290 will leak through the apertures into the ambient atmosphere. Consequently, the pressure in chamber 290 will fall to a pressure $P_{g2}$.

The present invention has been described in terms of a number of preferred embodiments. The invention, however, is not limited to the embodiments depicted and described. Rather, the scope of the invention is defined by the appended claims.

What is claimed is:

1. A carrier head, comprising:
    a base;
    a flexible member connected to the base and defining a first chamber and a substrate receiving surface; and
    a support pad positioned between the base and the flexible member, the support pad having a sensor aperture and a guardian member extending downward from the support pad and forming a wall around the sensor aperture to block a fluid that can be trapped between the substrate and the flexible member during a substrate attachment procedure from entering the sensor aperture.

2. The carrier head of claim 2, wherein the support pad further includes a plurality of apertures about the sensor aperture to trap the fluid and prevent the fluid from entering the sensor aperture.

3. The carrier head of claim 2, further including a valve to open or close a passage in the carrier head, wherein the sensor aperture is positioned below the valve so that the flexible member can deflect into the sensor aperture to actuate the valve if a fluid is evacuated from the chamber and the substrate is not attached to the substrate receiving surface.

4. A carrier head, comprising:
    a base;
    a flexible member joined to the base to define a chamber and a substrate receiving surface; and
    a support plate positioned between the base and the flexible member, the support plate including a sensor aperture and a plurality of apertures extending about the sensor aperture to provide a plurality of pockets to trap a fluid which may be present between a substrate and the flexible member as a result of a substrate attachment procedure.

5. The carrier head of claim 4, wherein the plurality of apertures include a guardian aperture positioned between an edge of the support plate and the sensor aperture to prevent the fluid from traveling directly from the edge of the support plate to the sensor aperture.

6. The carrier head of claim 5, wherein the guardian aperture is longer in length than the sensor aperture.

7. The carrier head of claim 5, wherein the guardian aperture is an annular aperture enclosing the sensor aperture.

8. The carrier head of claim 4, wherein the plurality of apertures of the support pad occupies a majority portion of a surface area of the support pad.

9. The carrier head of claim 4, wherein the plurality of apertures include apertures of different sizes.

10. The carrier head of claim 4, wherein the plurality of apertures include apertures of a uniform size.

11. The carrier head of claim 4, wherein the plurality of apertures provide a circuitous route between an edge of the substrate an the sensor aperture.

12. The carrier head of claim 4, wherein the apertures are indentations in the support plate.

13. The carrier head of claim 4, wherein the apertures are holes through the support plate.

14. The carrier head of claim 4, wherein the sensor aperture has a first shape and the plurality of holes have a second, different shape.

15. The carrier head of claim 14, wherein the first shape is circular.

16. The carrier head of claim 15, wherein the second shape is circular and the sensor aperture is larger than any one of the plurality of apertures.

17. The carrier head of claim 14, wherein the plurality of apertures have a uniform diameter between about 0.5 and 1.0 inches.

18. The carrier head of claim 14, wherein the second shape is arcuate.

19. The carrier head of claim 14, wherein the plurality of apertures include apertures of different sizes.

20. The carrier head of claim 3, further including:

a port fluidly coupled to the chamber; and a pump coupled to the port to vary a pressure level in the chamber.

21. The carrier head of claim 3, further comprising:

a second chamber; and a valve located in a passage between the chamber and the second chamber;

wherein the sensor aperture is positioned below the valve so that the flexible member deflects into the sensor aperture to actuate the valve if the substrate is not attached to the substrate receiving surface.

* * * * *